US009734785B2

(12) United States Patent
Cho et al.

(10) Patent No.: US 9,734,785 B2
(45) Date of Patent: Aug. 15, 2017

(54) GATE DRIVING UNIT

(71) Applicant: Samsung Display Co., LTD., Yongin, Gyeonggi-Do (KR)

(72) Inventors: Sehyoung Cho, Hwaseong-si (KR); Kyung-hoon Kim, Uiwang-si (KR); Dongwoo Kim, Seongnam-si (KR); Ilgon Kim, Seoul (KR); Meehye Jung, Suwon-si (KR); Kangmoon Jo, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/821,329

(22) Filed: Aug. 7, 2015

(65) Prior Publication Data
US 2016/0232866 A1 Aug. 11, 2016

(30) Foreign Application Priority Data

Feb. 5, 2015 (KR) ........................ 10-2015-0018112

(51) Int. Cl.
*G09G 3/36* (2006.01)
*G09G 3/3266* (2016.01)
*H03K 17/56* (2006.01)

(52) U.S. Cl.
CPC ......... *G09G 3/3677* (2013.01); *G09G 3/3266* (2013.01); *H03K 17/56* (2013.01); *G09G 2300/0413* (2013.01); *G09G 2300/0426* (2013.01); *G09G 2310/0267* (2013.01); *G09G 2310/0286* (2013.01); *G09G 2330/08* (2013.01)

(58) Field of Classification Search
CPC .................................................... G09G 3/3677
See application file for complete search history.

(56) References Cited

U.S. PATENT DOCUMENTS

| 2006/0203604 | A1* | 9/2006 | Park ..................... G09G 3/3648 365/185.23 |
| 2010/0079363 | A1 | 4/2010 | Chung et al. |
| 2012/0121061 | A1 | 5/2012 | Sakamoto et al. |

FOREIGN PATENT DOCUMENTS

| CN | 103928003 A | 7/2014 |
| EP | 2525350 A1 | 11/2012 |
| JP | 2010-217344 A | 9/2010 |
| JP | 2011-033846 A | 2/2011 |
| KR | 10-2012-0075126 A | 7/2012 |
| KR | 10-2013-0070300 A | 6/2013 |
| KR | 10-1303736 B1 | 8/2013 |

OTHER PUBLICATIONS

Neil Fanning, "European Search Report," European Patent Office, Jun. 27, 2016, 9 pages, The Hague, The Netherlands.

* cited by examiner

*Primary Examiner* — Daniel Puentes
(74) *Attorney, Agent, or Firm* — Innovation Counsel LLP

(57) ABSTRACT

Provided is a gate driving unit including: a plurality of stages configured to be activated sequentially so as to generate gate signals; and a plurality of repair blocks having sizes smaller than the corresponding stages and configured to repair defects of the stages. Each of the repair blocks is disposed proximate to two or more stages so as to be configured to repair defects in the two or more stages.

20 Claims, 13 Drawing Sheets

GATE DRIVING UNIT

CROSS-REFERENCE TO RELATED APPLICATIONS

This U.S. non-provisional patent application claims priority under 35 U.S.C. §119 to Korean Patent Application No. 10-2015-0018112 filed on Feb. 5, 2015, the entire contents of which are hereby incorporated by reference.

BACKGROUND

The present disclosure herein relates generally to flat panel displays. More specifically, the present disclosure relates to a gate driving unit for a flat panel display device.

In general, a flat panel display device includes a display panel with a plurality of pixels to display an image, a gate driving unit providing gate signals to the plurality of pixels, and a data driving unit providing data voltages to the plurality of pixels.

The gate driving unit generates gate signals and provides the generated gate signals to the pixels. The data driving unit generates data voltages and provides the generated data voltages to the pixels. The pixels receive the data voltages to display an image in response to the gate signals.

The gate driving unit includes a plurality of stages connected in cascade. Each stage includes a plurality of transistors connected to each other to output a gate voltage to a corresponding gate line. According to operations of these transistors, gate signals are outputted from the stages.

However, when stages of a gate driving unit are damaged, normal gate signals are not generated. As a result, a display device may not be driven properly.

SUMMARY

The present disclosure provides a gate driving unit capable of repairing a damaged gate driving unit, and a display device including the same.

Embodiments of the inventive concept provide gate driving units including: a plurality of stages configured to be activated sequentially so as to generate gate signals; and a plurality of repair blocks having sizes smaller than the corresponding stages and configured to repair defects of the stages, wherein each of the repair blocks is disposed proximate to two or more stages so as to be configured to repair defects in the two or more stages.

In some embodiments, each of the stages may include first and second transistor blocks connected to each other to generate the gate signal and a first capacitor, wherein the second transistor block may be disposed proximate to one side of the first transistor block and a first capacitor may be disposed proximate to another side of the first transistor block.

In still other embodiments, each of the repair blocks may be disposed between adjacent stages, so that each of the repair blocks is disposed between a kth stage and a k+1th stage, where k is an odd number.

In even other embodiments, the repair blocks may include at least one repair block disposed between the first transistor blocks and the first capacitors of the kth and k+1th stages.

In yet other embodiments, the repair blocks may include a plurality of second repair blocks disposed between the second transistor blocks of the kth and k+1th stages, and the first and second transistor blocks.

In further embodiments, the repair blocks may include: a first repair block disposed between the first transistor blocks and the first capacitors of the kth and k+1th stages; and second repair blocks disposed between the second transistor blocks of the kth and k+1th stages, and the first and second transistor blocks.

In still further embodiments, the first transistor block may include first and second transistors; the second transistor block may include third to sixteenth transistors that are smaller than the first and second transistors; and the first and second transistors may have the same size, be shaped to extend in a first direction, and be arranged side by side along a second direction intersecting the first direction.

In other embodiments, the first to sixteenth transistors may include an amorphous silicon thin film transistor or an oxide thin film transistor.

In even further embodiments, the second transistor of the kth stage and the second transistor of the k+1th stage may face each other.

In yet further embodiments, the first repair block may be disposed between the second transistors and the first capacitors of the kth and k+1th stages; and the second repair blocks may be disposed between the second transistor blocks of the kth and k+1th stages, and the second transistor blocks and the second transistors.

In yet further embodiments, the first transistors may include a plurality of connected first transistor units arranged along the first; and the second transistors may include a plurality of connected second transistor units arranged along the first direction.

In yet further embodiments, each of the first transistor units may include: a first gate electrode extending from a first conductive pattern; and a first source electrode and a first drain electrode extending from a second conductive pattern proximate to the first conductive pattern and having an insulation layer therebetween, wherein the each of the second transistor units may include: a second gate electrode extending from the first conductive pattern; and a second source electrode and a second drain electrode extending from the second conductive pattern. The first gate electrodes of the first transistor units may be connected to each other; the first source electrodes of the first transistor units may be connected to each other; the first drain electrodes of the first transistor units may be connected to each other; the second gate electrodes of the second transistor units may be connected to each other; the second source electrodes of the second transistor units may be connected to each other; and the second drain electrodes of the second transistor units may be connected to each other.

In yet further embodiments, the first repair block may include: a first repair transistor having the same size as at least one of the first transistor units or at least one of the second transistor units; a first repair pad disposed at the same layer as the second conductive pattern; and second and third repair pads disposed at the same layer as the first conductive pattern. The first repair transistor may include a first repair gate electrode, a first repair source electrode, and a first repair drain electrode that respectively have substantially the same shapes and sizes as the first gate electrode, the first source electrode, and the first drain electrode.

In yet further embodiments, the first repair gate electrode may extend so as to overlap the first repair pad; the first repair source electrode may extend so as to overlap the second repair pad; and the first repair drain electrode may extend so as to overlap the third repair pad.

In yet further embodiments, the first gate electrodes and the second gate electrode may extend so as to overlap the first repair pad; the first source electrodes and the second source electrodes may so as to overlap the second repair pad;

and the first drain electrodes and the second drain electrodes may extend so as to overlap the third repair pad.

In yet further embodiments, the fourth, fourteenth, and fifteenth transistors may be larger than the sixth transistor; the sixth transistor may be larger than the seventh transistor; the seventh transistor may be larger than the eighth and sixteenth transistors; the eighth and sixteenth transistors may be larger than the third, ninth, tenth, and eleventh transistors; and the third, ninth, tenth, and eleventh transistors may be larger than the fifth, twelfth, and thirteenth transistors.

In yet further embodiments, each of the second repair blocks may include: a plurality of second repair transistors each including a second repair gate electrode, a second repair source electrode, and a second repair drain electrode; a fourth repair pad disposed at the same layer as the second repair source and drain electrodes; and fifth and sixth repair pads disposed at the same layer as the second repair gate electrode.

In yet further embodiments, each of the third, ninth, tenth, and eleventh transistors may have the same size as one second repair transistor; each of the eighth and sixteenth transistors may have the same size as two second repair transistors; the seventh transistor may have the same size as three second repair transistors; the sixth transistor may have the same size as four second repair transistors; and each of the fourth, fourteenth, and fifteenth transistors may have the same size as five second repair transistors.

In yet further embodiments, the second repair gate electrodes of the second repair transistors may be connected to each other and extend so as to overlap the fourth repair pad; the repair source electrodes of the second repair transistors may be connected to each other and extend so as to overlap the fifth repair pad; and the second repair drain electrodes of the second repair transistors may be connected to each other and extend so as to overlap the sixth repair pad.

In yet further embodiments, gate electrodes of the third, fourth, sixth to eleventh, and fourteenth to sixteenth transistors each may extend so as to overlap the fourth repair pad; source electrodes of the third, fourth, sixth to eleventh, and fourteenth to sixteenth transistors each may extend so as to overlap the fifth repair pad; and drain electrodes of the third, fourth, sixth to eleventh, and fourteenth to sixteenth transistors each may extend so as to overlap the sixth repair pad.

In other embodiments of the inventive concept, gate driving units include: a plurality of pixels connected to a plurality of gate lines and a plurality of data lines; and a gate driving unit connected to the gate lines to output gate signals. The gate driving unit includes: a plurality of stages configured to be activated sequentially so as to generate gate signals; and a plurality of repair blocks having sizes smaller than the corresponding stages and configured to repair defects of the stages, wherein each of the repair blocks is disposed proximate to two or more stages so as to be configured to repair defects in the two or more stages.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
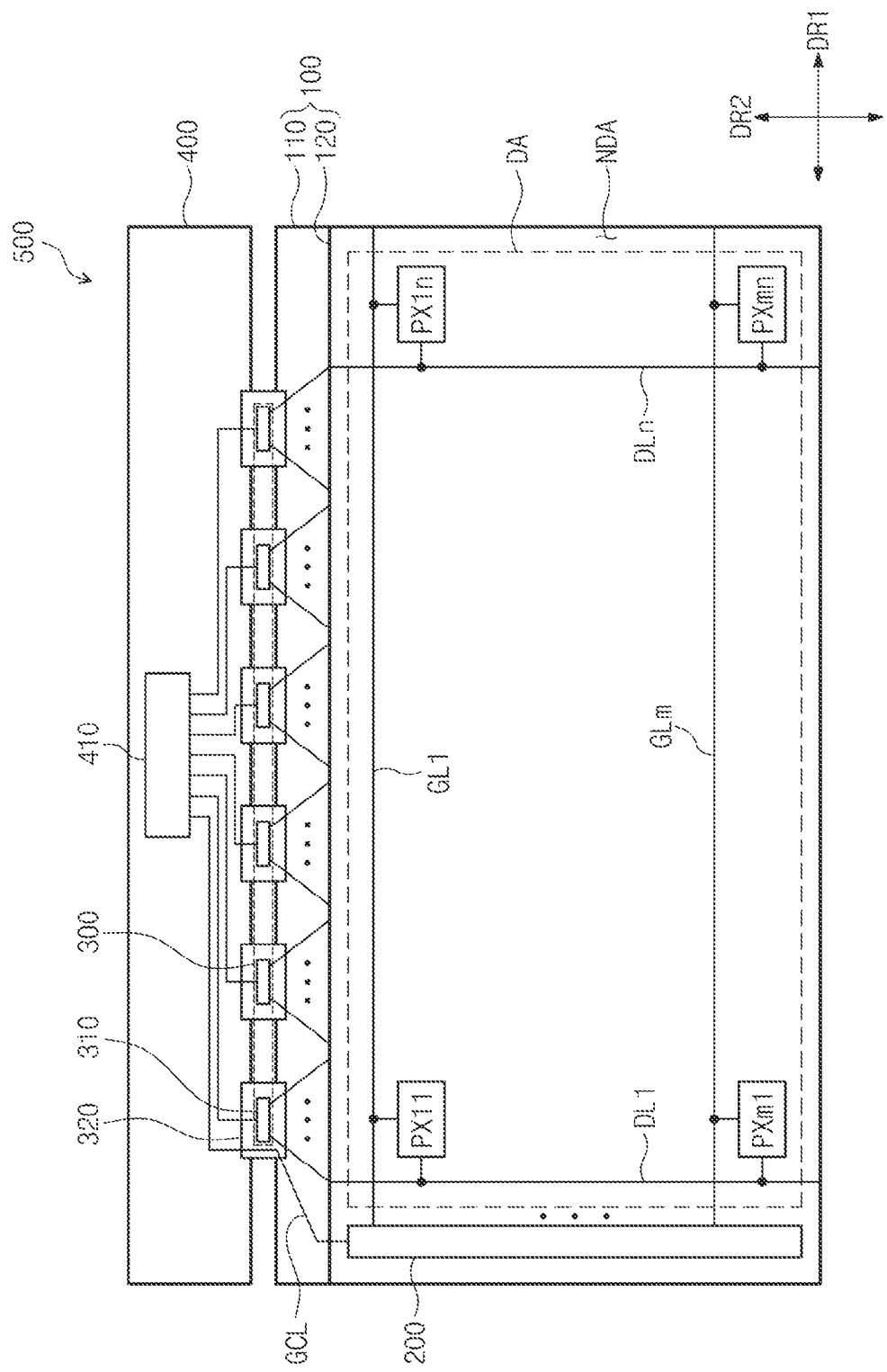
FIG. 1 is a plan view of a display device according to an embodiment of the present disclosure.

Advantages and features of the present disclosure and methods of accomplishing the same become clear with reference to embodiments described in more detail below. However, the present disclosure will be embodied in many different forms and is not limited to the embodiments set forth herein. Rather, these embodiments are also to complete the disclosure of the present disclosure and are provided for those skilled in the art to fully convey the concept of the present disclosure. The present disclosure will only be defined by the appended claims. Like reference numerals refer to like elements throughout the specification.

When an element or a layer is referred to as being "on" on another device or layer, it may be directly on the other device or layer or intervening elements or layers may exist. On the other hand, when a device is referred to as being "directly on", this means that there is no intervening device or layer. The term "and/or" includes any and all combinations of one or more of the associated listed items.

The spatially relative terms "below", "beneath", "lower" "above", and "upper" may be used to easily describe the correlation between one device or component and another device or component as shown in the drawings. Spatially relative terms should be understood as terms including different directions of a device in use or operation in addition to a direction shown in the drawing. Like reference numerals refer to like elements throughout the specification.

Although the terms first, second and the like are used to describe various devices, components and/or sections, it is apparent that these devices, components and/or sections are not limited to the terms. These terms are only used to distinguish one device, component, or section from other devices, components, or sections. Therefore, it is apparent that a first element, a first component or a first section mentioned below may be a second element, a second component, or a second section within the technical scope of this disclosure.

Embodiments in this specification will be described with plan views and sectional views, that is, ideal exemplary views of the present disclosure. Therefore, the forms of exemplary diagrams may be modified due to manufacturing techniques and/or tolerances. Thus, embodiments of this disclosure are not limited to specific forms shown and also comprise changes in forms produced according to manufacturing processes. Thus, areas exemplified in the drawings have general properties, and the forms of areas shown in the drawings are used to illustrate a specific shape of a device area. Thus, this should not be construed as limited to the scope of the present disclosure. The various Figures are not to scale. All numerical values are approximate, and may vary. All examples of specific materials and compositions are to be taken as nonlimiting and exemplary only. Other suitable materials and compositions may be used instead.

Hereinafter, preferred embodiments of the present disclosure are described in more detail with reference to the accompanying drawings.

FIG. 1 is a plan view of a display device according to an embodiment of the present disclosure.

Referring to FIG. 1, a display device 500 of the present disclosure includes a display panel 100, a gate driving unit 200, a data driving unit 300, and a printed circuit board 400.

The display panel 100 may be a liquid crystal panel including a liquid crystal layer, an electrophoretic display panel including an electrophoretic layer, an electro-wetting display panel including an electro-wetting layer, an organic light emitting display panel including an organic light emitting layer, or the like.

The display panel 100 includes a first substrate 110, a second substrate 120 facing the first substrate 110, and an image display layer (not shown) disposed between the first substrate 110 and the second substrate 120. As the image display layer, various layers such as a liquid crystal layer, an electrophoretic layer, an electro-wetting layer, or an organic light emitting layer may be used.

The display panel 100 includes a plurality of gate lines GL1-GLm, a plurality of data lines DL1 to DLn, and a plurality of pixels PX11 to PXmn. Here, m and n are integers greater than 0. Additionally, the display panel 100 includes a display area DA that displays an image, and a non-display area NDA that is disposed to surround the display area DA and that does not display an image.

The gate lines GL1 to GLm and the data lines DL1 to DLn are disposed on the first substrate 110. The Gate lines GL1 to GLm and the data lines DL1 to DLn are disposed to be insulated from each other and to intersect each other.

The gate lines GL1 to GLm extend in a first direction DR1 to be connected to the gate driving unit 200. The data lines DL1 to DLn extend in a second direction DR2 intersecting the first direction DR1 to be connected to the data driving unit 300. The first direction DR1 may be a row direction and the second direction DR2 may be a column direction.

The pixels PX11 to PXmn are arranged in a matrix configuration and disposed in the display area DA. For example, the pixels PX11 to PXmn are disposed in areas bordered by the gate lines GL1 to GLm and the data lines DL1 to DLm. Accordingly, the pixels PX11 to PXmn may be arranged in m rows and n columns.

Each of the pixels PX11 to PXmn is connected to a corresponding gate line of the gate lines GL1 to GLm and a corresponding data line of the data lines DL1 to DLn. Each of the pixels PX11 to PXmn may display one of the primary colors. The primary colors may include red, green, blue, and white. However, the primary colors are not limited thereto and may further include various colors such as yellow, cyan, and magenta.

The gate driving unit 200 may be disposed in the non-display area NDA adjacent to one side of the display area DA in the first direction DR1, although it may be disposed at any other suitable part of non-display area NDA as well. The gate driving unit 200 includes a plurality of transistors. A specific configuration of the gate driving unit 200 will be described later.

The transistors of the gate driving unit 200 and the transistors of the pixels PX11 to PXmn disposed in the display area DA may be formed at substantially the same time through the same process. The gate driving unit 200 may be integrated into the first substrate 110 of the display panel 100 in an Amorphous Silicon TFT Gate driver circuit (ASG) form. That is, the transistors of the gate driving unit 200 may include amorphous silicon thin film transistors.

However, the present disclosure is not limited thereto and the gate driving unit 200 may be integrated into the first substrate 110 of the display panel 100 in an Oxide Silicon TFT Gate driver circuit (OSG) form. That is, the transistors of the gate driving unit 200 may include oxide silicon thin film transistors including an oxide semiconductor.

The gate driving unit 200 receives a gate control signal from a timing controller 410 (hereinafter referred to as a signal control unit) integrated onto the printed circuit board 400. Although not shown in the drawings, the signal control unit 410 is integrated onto the printed circuit board 400 in the form of an integrated circuit chip so that it may be connected to the gate driving unit 200 and the data driving unit 300.

A gate control signal is provided to the gate driving unit 200 through a gate control line GCL connected between the signal control unit 410 and the gate driving unit 200. The gate control line GCL is connected to the gate driving unit 200 through the leftmost flexible circuit board 320 shown in FIG. 1. However, the present disclosure is not limited thereto and the gate control line GCL may be connected to the gate driving unit 200 through any one of the flexible circuit boards 320.

The gate driving unit 200 generates a plurality of gate signals in response to a gate control signal. The gate signals may be output sequentially. The gate signals are provided to the pixels PX11 to PXmn by row, through the gate lines GL1 to GLm. As a result, the pixels PX11 to PXmn may be driven by row.

The data driving unit 300 includes a plurality of source driving chips 310. The source driving chips 310 are integrated onto the flexible circuit boards 320 to be connected to the driving circuit board 400 and the first substrate 110 of the non-display area NDA, adjacent to the upper side of the display area DA. For example, the data driving unit 300 may be connected to the display panel 100 through a Tape Carrier Package (TCP) method.

However, the present disclosure is not limited thereto and the data driving unit 300 may instead, for example, be formed of a plurality of driving chips to be integrated onto the first substrate 110 of the display panel 100 through a chip on glass (COG) method.

The data driving unit 300 receives image signals and a data control signal from the signal control unit 410. The data driving unit 300 generates analog data voltages corresponding to the image signals, in response to the data control signal. The data voltages are provided to the pixels PX11 to PXmn through the data lines DL1 to DLn.

The pixels PX11 to PXmn receive the data voltages through the data lines DL1 to DLn in response to the gate signals received through the gate lines GL1 to GLm. The pixels PX11 to PXmn display grayscales corresponding to the data voltages. As a result, an image may be displayed.

Figure 2:
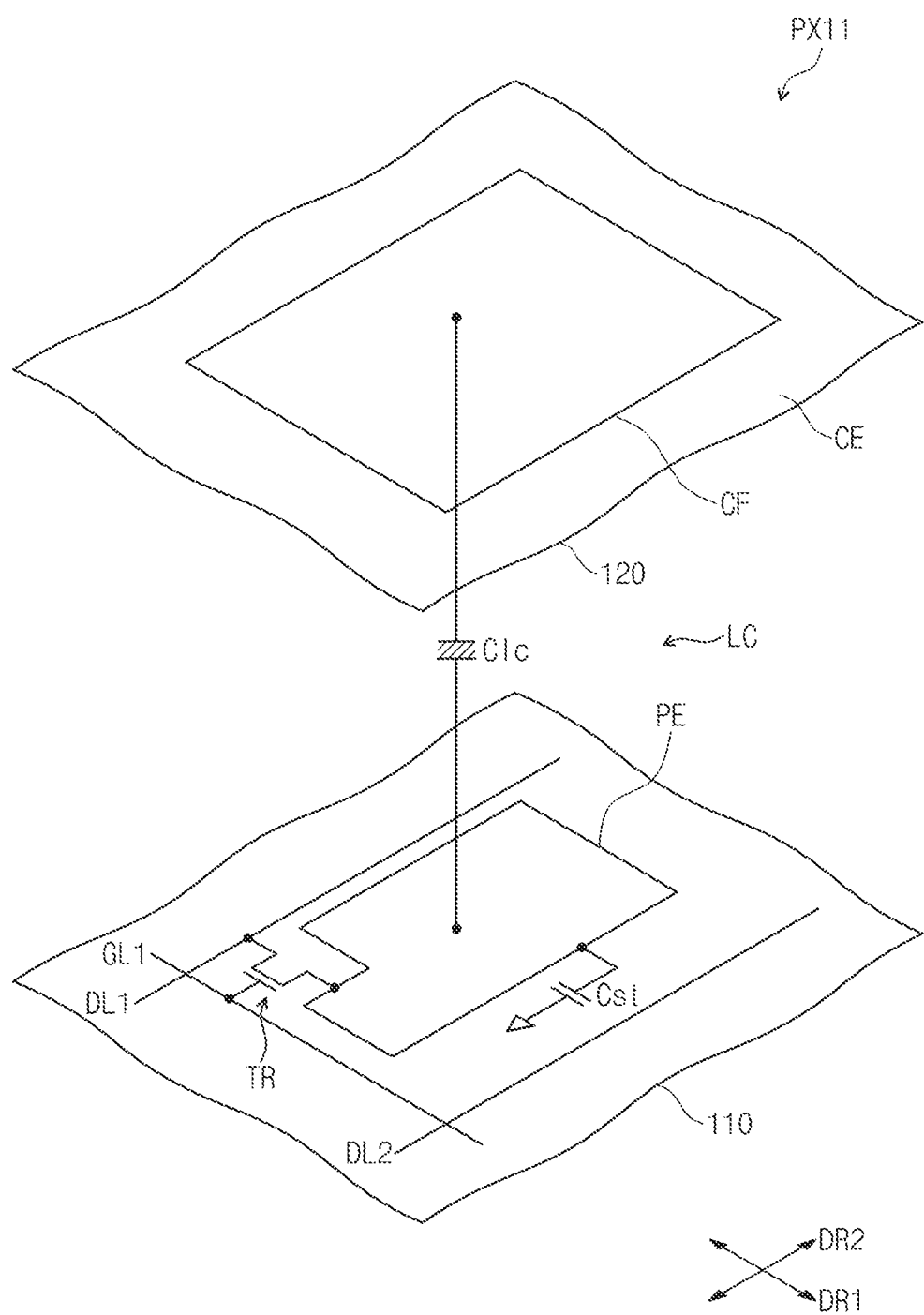
FIG. 2 is an equivalent circuit diagram of one pixel shown in FIG. 1.

FIG. 2 is an equivalent circuit diagram of one pixel shown in FIG. 1.

For convenience of description, a pixel PX11 connected to a first gate line GL1 and a first data line DL1 is shown in FIG. 2. Although not shown in the drawing, configurations of other pixels of the display panel 100 are substantially identical to that of the pixel PX11 shown in FIG. 2.

Referring to FIG. 2, the display panel 100 includes a first substrate 110, a second substrate 120 facing the first substrate 110, and an image display layer LC disposed between the first substrate 110 and the second substrate 120. As mentioned above, the image display layer LC may be a liquid crystal layer LC.

The pixel PX11 includes a transistor TR connected to the first gate line GL1 and the first data line DL1, a liquid crystal capacitor Clc connected to the transistor TR, and a storage capacitor Cst connected in parallel to the liquid crystal capacitor Clc. The storage capacitor Cst may be omitted.

The transistor TR includes a gate electrode connected to the first gate line GL1, a source electrode connected to the first data line DL1, and a drain electrode connected to the liquid crystal capacitor Clc and the storage capacitor Cst.

The liquid crystal capacitor Clc includes a pixel electrode PE disposed on the substrate 110, a common electrode CE disposed on the second substrate 120, and a liquid crystal layer LC disposed between the pixel electrode PE and the common electrode CE. The liquid crystal layer LC serves as a dielectric. The pixel electrode PE is connected to the drain electrode of the transistor TR.

The pixel electrode PE of FIG. 2 has a non-slit structure (i.e. it is shown as a single unitary structure with no holes, cutouts, or thin protrusions) but is not limited thereto and thus, the pixel electrode PE may have a slit structure including a cross-shaped part and a plurality of branch parts radially extending from the cross-shaped part.

The common electrode CE may be formed over substantially the entire substrate 120. However, the present disclosure is not limited thereto and the common electrode CE may be formed on the first substrate 110. In this case, at least one of the pixel electrode PE and the common electrode CE may have a slit.

The storage capacitor Cst may include a portion of pixel electrode PE, a storage electrode (not shown) branched from a storage line (not shown), and an insulation layer disposed between the pixel electrode PE and the storage electrode. The storage line may be disposed on the first substrate 110 and may be formed at the same layer as the gate lines GL1 to GLm. The storage electrode may overlap the pixel electrode completely or partially.

The pixel PX may further include a color filter CF representing one of the primary colors. As an exemplary embodiment, the color filter CF, as shown in FIG. 2, may be disposed on the second substrate 120. However, the present disclosure is not limited thereto and the color filter CF may instead be disposed on the first substrate 110.

The transistor TR is turned on in response to a gate signal provided through the first gate line GL1. Then, a data voltage received through the first data line DL1 is provided to the pixel electrode PE of the liquid crystal capacitor Clc through the turned-on transistor TR. At the same time, a common voltage is applied to the common electrode CE.

An electric field between the pixel electrode PE and the common electrode CE is formed due to a voltage level difference between the data voltage and the common voltage. The liquid crystal molecules of the liquid crystal layer LC are driven by the electric field formed between the pixel electrode PE and the common electrode CE. Light transmittance is adjusted by the liquid crystal modules according to the electric field, so that an image may be displayed.

Although not shown in the drawing, a backlight unit for providing light to the display panel 100 may be disposed at the rear of the display panel 100.

A storage voltage having a predetermined voltage level may be applied to the storage line. However, the present disclosure is not limited thereto and the storage line may, for example, receive a common voltage instead. The storage capacitor Cst serves to complement a voltage charged to the liquid crystal capacitor Clc.

Figure 3:
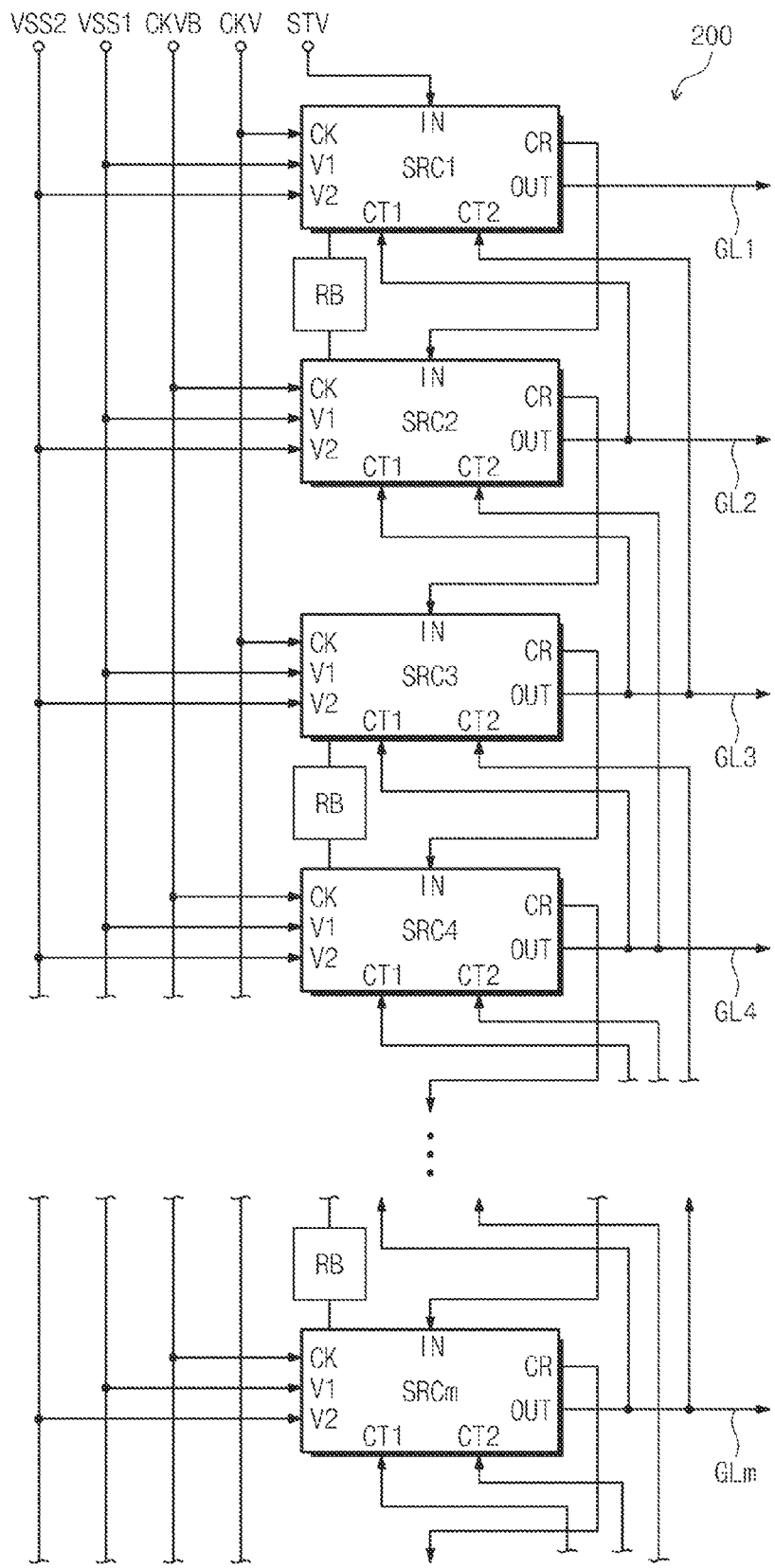
FIG. 3 is a view illustrating a configuration of a gate driving unit shown in FIG. 1.

FIG. 3 is a view illustrating a configuration of a gate driving unit shown in FIG. 1.

Referring to FIG. 3, the gate driving unit 200 includes a plurality of stages SRC1 to SRCm and a plurality of repair blocks RB. The stages SRC1 to SRCm are activated sequentially to generate gate signals.

The stages SRC1 to SRCm are electrically connected to the gate lines GL1-GLm to output gate signals. Each of the stages SRC1 to SRCm includes an input terminal IN, a clock terminal CK, first and second voltage terminals V1 and V2, first and second control terminals CT1 and CT2, an output terminal OUT, and a carry terminal CR.

A gate control signal may include a start signal STV, a first clock signal CKV, and a second clock signal CKBV. The first clock signal CKV and the second clock signal CKVB may have opposite phases.

The carry terminal CR of each of the stages SRC1 to SRCm is electrically connected to the input terminal IN of the next stage. That is, the carry terminal CR of the ith stage is electrically connected to the input terminal IN of the i+1th stage. Here, i is greater than 0 and is an integer less than or equal to m−2.

The first stage SRC1 among the stages SRC1 to SRCm may be activated by receiving the start signal STV. The input terminal IN of each of the second to mth stages SRC2 to SRCm may be activated by receiving a carry signal output from the carry terminal CR of a previous stage. Accordingly, as mentioned above, the stages SRC1 to SRCm may be activated sequentially.

The odd-numbered stages SRC1, SRC3 . . . , and SRCm-1 of the stages SRC1 to SRCm and the even-numbered stages SRC2, SRRC4 . . . , and SRCm of the stages SRC1 to SRCm may receive clock signals of opposite phases. For example, the clock terminals CK of the odd-numbered stages SRC1, SRC3 . . . , and SRCm-1 may receive first clock signals CKV. The clock terminals CK of the even-numbered stages SRC2, SRRC4 . . . , and SRCm may receive second clock signals CKVB.

A first voltage VSS1 (or a first low voltage) may be applied to the first voltage terminal V1 of each of the stages SRC1 to SRCm. A second voltage VSS2 (or a second low voltage) may be applied to the second voltage terminal V2 of each of the stages SRC1 to SRCm.

The second voltage VSS2 may have a lower voltage level than the first voltage VSS1. The first voltage VSS1 may be a ground voltage or a negative voltage. For example, the first voltage VSS1 may be about −6 V and the second voltage VSS2 may be about −10 V.

The first control terminal CT1 of the ith stage is connected to the output terminal OUT of the i+1th stage. The second control terminal CT2 of the ith stage is connected to the output terminal OUT of the i+2th stage.

The first control terminal CT1 of the ith stage receives a gate signal outputted from the output terminal OUT of the i+1th stage. The second control terminal CT2 of the ith stage receives a gate signal outputted from the output terminal OUT of the i+2 stage.

A start signal STV, a carry signal, and gate signals, which are applied to the input terminal IN and the first and second control terminals CT1 and CT2 of each of the stages SRC1 to SRCm, are control signals for controlling operations of the stages SRC1 to SRCm.

The first and second control terminals CT1 and CT2 of the last stage SRCm may receive signals corresponding to the gate signals from dummy stages (not shown). The dummy stages are stages that are not substantially connected to the gate lines GL1 to GLm.

The output terminal OUT of each of the stages SRC1 to SRCm is connected to a corresponding one of the gate lines GL1 to GLm. The output terminals OUT of the stages SRC1 to SRCm may output gate signals sequentially through the gate lines GL1 to GLm.

A high level of the first and second clock signals CKV and CKVB may be a gate on voltage for driving a pixel, and a low level thereof may be a gate off voltage. The output terminal OUT of each of the stages SRC1 to SRCm outputs a high level section of a clock signal provided to the first clock terminal CK.

The carry terminal CR of each of the stages SRC1 to SRCm outputs a carry signal having the same phase and the same magnitude as a gate signal.

Each repair block RB has a smaller size than each of the stages SRC1 to SRCm. The repair blocks RB are disposed next to each unit of corresponding two or more stages of the plurality of stages SRC1 to SRCm. Additionally, the repair blocks RB are disposed to share each corresponding two or more stages.

For example, as shown in FIG. 3, each repair block RB is disposed between two adjacent stages and to share these two stages. Accordingly, the number of repair blocks RB shown in FIG. 3 is m/2. However, the present disclosure is not limited thereto and each repair block RB may correspond to more than two stages.

Although each repair block RB is disposed between two stages as shown in a block diagram, each repair block RB is substantially arranged to overlap one pair of stages.

Additionally, when the transistors of adjacent two stages are damaged, each repair block RB includes a repair device for replacing a damaged transistor, and repair lines extending from the repair device and disposed to overlap adjacent stages. Such a configuration will be described below in more detail.

Figure 4:
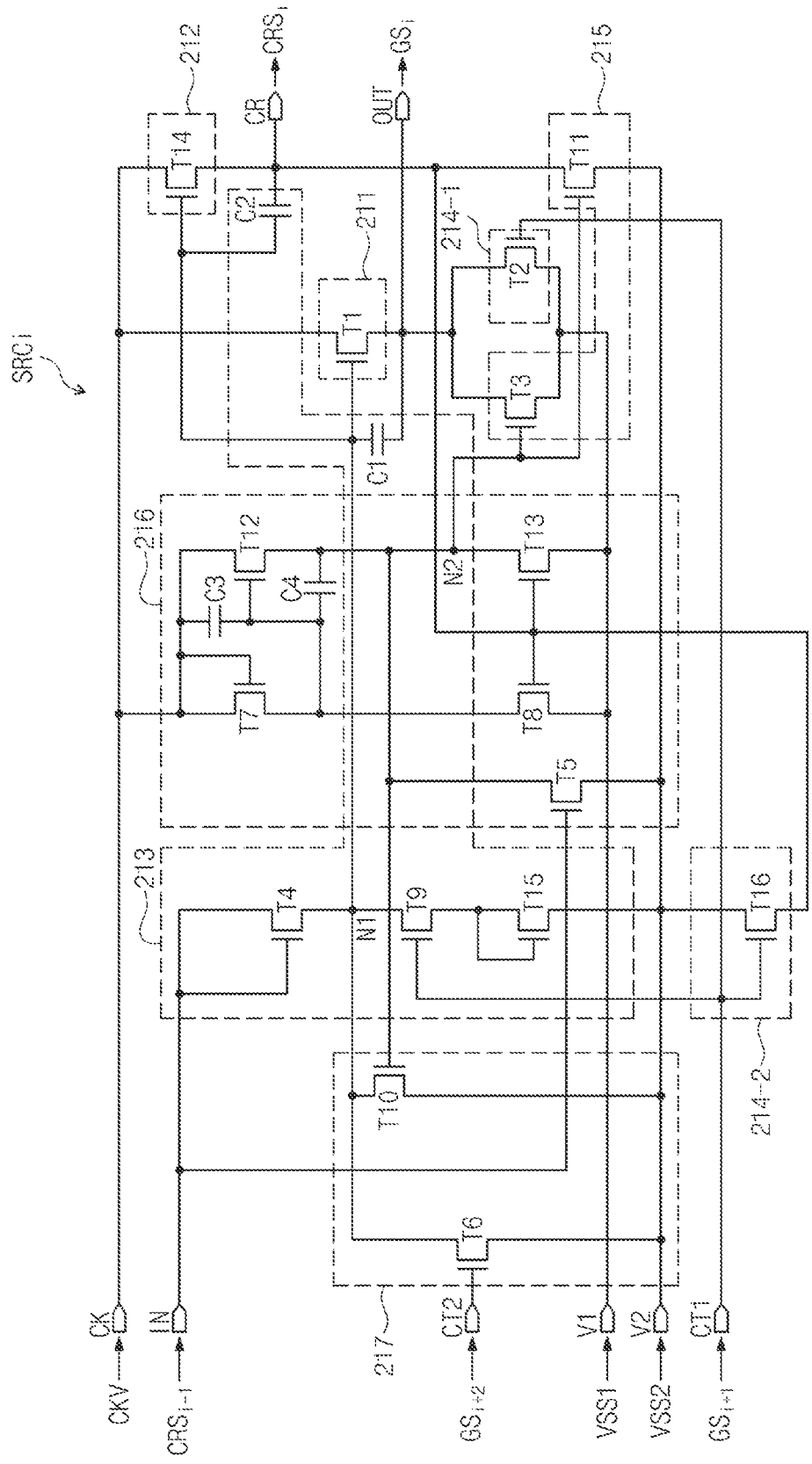
FIG. 4 is a circuit diagram of an ith stage among stages shown in FIG. 3.

FIG. 4 is a circuit diagram of an ith stage of FIG. 3.

Although a circuit diagram of an ith stage SRCi is shown in FIG. 4, other stages shown in FIG. 3 have substantially the same configuration. Accordingly, hereinafter, a circuit configuration of the ith stage SCi is described and descriptions for configurations of other stages are omitted.

Referring to FIG. 4, the ith stage SRCi includes first to sixteenth transistors T1 to T16 connected to each other to generate a gate signal, and first to fourth capacitors C1 to C4.

Additionally, according to a function of the first to sixteenth transistors T1 to T16, the ith stage SRCi includes a first output unit 211, a second output unit 212, a control unit 213, a first pull-down unit 214-1, a second pull-down unit 214-2, a holding unit 215, a switching unit 216, and a stabilization unit 217.

The first output unit 211 outputs a gate signal GSi to an ith gate line. The second output unit 212 provides a carry signal CRSi to the i+1th stage.

The control unit 213 controls operations of the first output unit 211 and the second output unit 212. In more detail, the control unit 213 turns on the first output unit 211 and the second output unit 212 in response to the carry signal CRSi-1 of the i−1th stage. Additionally, the control unit 213 turns off the first output unit 211 and the second output unit 212 in response to the gate signal GSi+1 of the i+1th stage.

The first pull-down unit 214-1 pulls down the potential of the output terminal OUT to a first voltage VSS1. The second pull-down unit 214-2 pulls down the potential of the carry terminal CR to a second voltage VSS2. The holding unit 215 holds the gate signal GSi at the first voltage VSS1 via a turned-off first output unit 211. The holding unit 215 holds the carry signal CRSi at the second voltage VSS2 via a turned-off second output unit 212.

The switching unit 216 controls on/off operations of the holding unit 215. A second node N2 is an output terminal of the switching unit 216 and is connected to control terminals of the holding unit 215. The stabilization unit 217 stabilizes the potential of a first node N1 during a low section of the gate signal GSi.

The first output unit 211 includes a first transistor T1. The first transistor T1 includes an input electrode for receiving a first clock signal CKV, a control electrode connected to the control unit 213, and an output electrode for outputting a gate signal GSi. The control electrode of the first transistor T1 is connected to the first node N1 that is the output terminal of the control unit 213.

The second output unit 212 includes a fourteenth transistor T14. The fourteenth transistor T14 includes an input electrode for receiving a first clock signal CKV, a control electrode connected to the control electrode of the first transistor T1, and an output electrode for outputting a carry signal CRSi.

The control unit 213 includes fourth, ninth, and fifteenth transistors T4, T9, and T15 and first and second capacitors C1 and C2. The fourth transistor T4 includes a control electrode and an input electrode for commonly receiving the carry signal CRSi−1 of the i−1th stage and an output electrode connected to the control electrodes of the first and fourteenth transistors T1 and T14 through the first node N1. The carry signal CRSi−1 of the i−1th stage is a switching control signal of the fourth transistor T4.

The ninth transistor T9 includes an output electrode connected to the first node N1, a control electrode for receiving the gate signal GSi+1 of the i+1th stage, and an input electrode. The fifteenth control transistor T15 includes a control electrode and an output electrode commonly connected to the input electrode of the ninth transistor T9, and an input electrode connected to the second voltage terminal V2.

The first capacitor C1 is connected between the control electrode and the output electrode of the first transistor T1. The second capacitor C2 is connected between the control electrode and the output electrode of the fourteenth transistor T14.

When the fourth transistor T4 is turned on in response to the carry signal CRSi−1 of the i−1th stage, the potential of the first node N1 rises to a first high voltage, and the first transistor T1 and the fourteenth transistor T14 are both turned on.

When the carry signal CRSi−1 of the i−1th stage is applied to the first node N1, the first capacitor C1 is charged. Then, the first transistor T1 is bootstrapped. That is, the first node N1 connected to the control electrode of the first transistor T1 is boosted from a high voltage to a second high voltage.

When the ninth transistor T9 and the fifteenth transistor T15 are turned on in response to the gate signal GSi+1 of the i+1th stage, the potential of the first node N1 is reduced. At this point, the potential of the first node N1 is slightly higher than the second voltage VSS2 due to the influence of the fifteenth transistor T15. When the potential of the first node N1 is reduced, the first and fourteenth transistors T1 and T14 connected to the first node N1 are turned off.

The first pull-down unit 214-1 includes a second transistor T2. The second transistor T2 includes an output electrode connected to the output electrode of the first transistor T1, a control electrode for receiving the gate signal GSi+1 of the i+1th stage, and an input electrode connected to the first voltage terminal V1. The second transistor T2 drops the potential of the output terminal OUT down to first voltage VSS1 in response to the gate signal GSi+1 of the i+1th stage.

The second pull-down unit 214-2 includes a sixteenth transistor T16. The sixteenth transistor T16 includes a control electrode for receiving the gate signal GSi+1 of the i+1th stage, an input electrode connected to the second voltage terminal V2, and an output electrode connected to the output terminal of the fourteenth transistor T14. The sixteenth transistor T16 drops the potential of the carry terminal CR down to second voltage VSS2 in response to the gate signal GSi+1 of the i+1th stage.

The holding unit 215 includes third and eleventh transistors T3 and T11. The third transistor T3 includes an output electrode connected to the output electrode of the first transistor T1, a control electrode connected to the second node N2, and an input electrode connected to the first voltage terminal V1.

The eleventh transistor T11 includes an output electrode connected to the output electrode of the fourteenth transistor T14, a control electrode connected to the second node N2, and an input electrode connected to the second voltage terminal V2.

The third transistor T3 holds the potential of the output terminal OUT at a first voltage VSS1 when the first transistor T1 is turned off. The eleventh transistor T11 holds the potential of the carry terminal CR at a second voltage VSS2 when the fourteenth transistor T14 is turned off.

The switching unit 216 provides the second voltage VSS2 to the second node N2 when the first output unit 211 is turned on in response to the carry signal CRSi−1 of the i−1th stage. The holding unit 215 receiving the second voltage VSS2 is turned off. Then, the switching unit 216 provides a first voltage VSS1 to the second node N2 in response to a first clock signal CKV. The turned-off state of the holding unit 215 receiving the first voltage VSS1 is maintained.

The switching unit 216 provides a voltage corresponding to the first clock signal CKV to the second node N2 when the first output unit 211 is turned off. That is, the first voltage VSS1 and a third high voltage corresponding to a high level of the first clock signal CKV are alternately applied to the second node N2 when the first output unit 211 is turned off. When the third high voltage is applied to the second node N2 while the first output unit 211 is turned off, the holding unit 215 is turned on.

The switching unit 216 includes fifth, seventh, eighth, twelfth, and thirteenth transistors T5, T7, T8, T12, and T13 and third and fourth capacitors C3 and C4. The fifth transistor T5 includes a control electrode for receiving the carry signal CRSi−1 of the i−1th stage, an output electrode connected to the second node N2, and an input electrode connected to the second voltage terminal V2.

The seventh transistor T7 includes an input electrode and a control electrode for commonly receiving a first clock signal CKV, and an output electrode connected to the output electrode of the eighth transistor T8. The eighth transistor T8 includes a control electrode connected to the output electrode of the sixteenth transistor T16, an input electrode connected to the first voltage terminal V1, and an output electrode connected to the seventh transistor T7 as above.

The twelfth transistor T12 includes an input electrode for receiving a first clock signal CKV, a control electrode connected to the output electrode of the seventh transistor T7, and an output electrode connected to the second node N2.

The thirteenth transistor T13 includes a control electrode that receives the carry signal CRSi from the second output unit 212 and that is connected to the output electrode of the sixteenth transistor T16, and an input electrode connected to the first voltage terminal V1.

The third capacitor C3 is connected between the input electrode and the control electrode of the twelfth transistor T12. The fourth capacitor C4 is connected between the output electrode of the seventh transistor T7 and the output electrode of the twelfth transistor T12.

The fifth transistor T5 supplies the second voltage VSS2 to the second node N2 in response to the carry signal CRSi−1 of the i−1th stage. The thirteenth transistor T13 supplies the first voltage VSS1 to the second node N2 when the second output unit 212 is turned on. Accordingly, the third and eleventh transistors T3 and T11 are turned off by the first voltage VSS1 when the second output unit 212 is turned on.

The eighth transistor T8 is turned on when the second output unit 212 is turned on, so that it drops down the first clock signal CKV to the first voltage VSS1. Accordingly, the first clock signal CKV is kept from being applied to the second node N2. A time when the second output unit 212 is turned on may correspond to a high level of the first clock signal CKV.

The third and fourth capacitors C3 and C4 are charged with a voltage according to the first clock signal CKV. Then, the twelfth transistor T12 is turned on by a voltage charged to the third and fourth capacitors C3 and C4. Additionally, when the fifth, eighth, and thirteenth transistors T5, T8, and T13 are turned off, the potential of the second node N2 rises by a voltage charged to the third and fourth capacitors C3 and C4.

When the potential of the second node N2 rises, the third and eleventh transistors T3 and T11 are turned on and thereby, the output terminal OUT and the carry terminal CR are held at the first voltage VSS1 and the second voltage VSS2.

The stabilization unit 217 includes sixth and tenth transistors T6 and T10. The sixth transistor T6 includes a control electrode for receiving the gate signal GSi+2 of the i+2th stage, an input electrode connected to the second voltage terminal V2, and an output electrode connected to the first node N1. The tenth transistor T10 includes a control electrode connected to the second node N2, an input electrode connected to the second voltage terminal V2, and an output electrode connected to the first node N1.

The sixth transistor T6 supplies the second voltage VSS2 to the first node N1 in response to the gate signal GSi+2 of the i+2th stage. Accordingly, the potential of the first node N1 may be stabilized to the second voltage VSS2 by the gate signal GSi+2 of the i+2th stage.

The tenth transistor T10 is turned on/off according to the potential of the second node N2. When the potential of the second node N2 is dropped down to the first voltage VSS1, the tenth transistor T10 is turned off. When the potential of the second node N2 rises by the first clock signal CKV, the tenth transistor T10 is turned on. The turned-on tenth transistor T10 drops the potential of the first node N1 down to the second voltage VSS2.

Accordingly, the potential of the first node N1 may be stabilized to the second voltage VSS2 by the sixth and tenth transistors T6 and T10 during a low level of the gate signal GSi.

Figure 5:
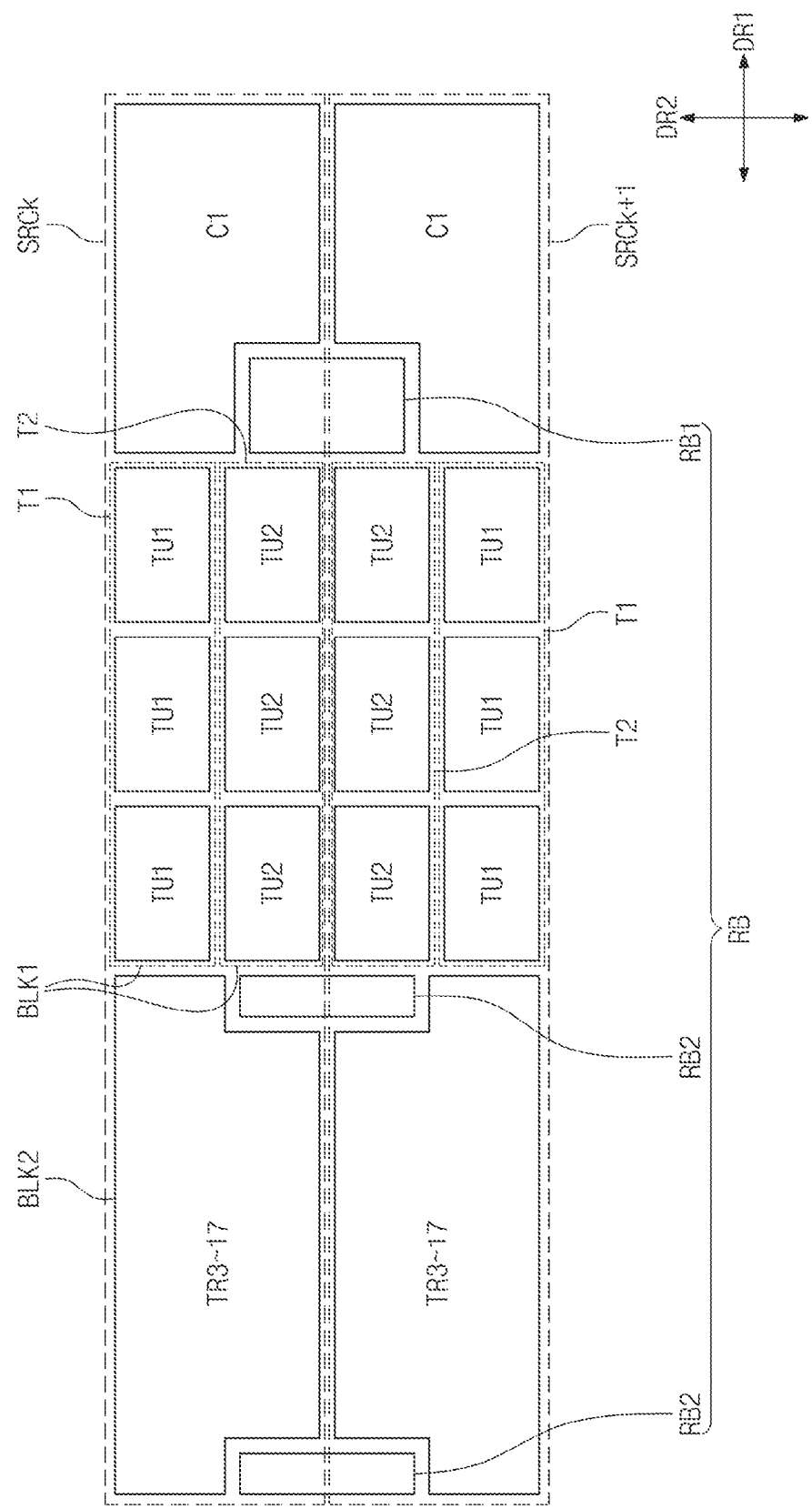
FIG. 5 is a view illustrating an arrangement state of one repair block, and first to sixteenth transistors and a first capacitor of stages sharing the one repair block according to an embodiment of the present disclosure.

FIG. 5 is a view illustrating an arrangement state of one repair block, and first to sixteenth transistors and a first capacitor of stages sharing the repair block, according to an embodiment of the present disclosure.

For convenience of description, referring to FIG. 5, a connection configuration of first to sixteenth transistors T1 to T16 is not shown and the first transistor T1, the second transistor T2, the third to sixteenth transistors T3 to T16, and the first capacitor C1 are instead represented as blocks.

Hereinafter, two stages share one repair block RB, and the two stages are referred to as a kth stage SRCk and a k+1th stage SRCk+1. Here, k is an odd number and k+1 is less than or equal to m.

Referring to FIG. 5, the repair block RB is disposed to share corresponding kth and k+1th stages SRCk and SRCk+1. That is, the repair block RB is disposed to overlap the kth stage SRCk and the k+1th stage SRCk+1.

Each of the stages SRCk and SRCk+1 may include a first transistor block BLK1 where the first and second transistors T1 and T2 are disposed, and a second transistor block BLK2 where the third to sixteenth transistors T3 to T16 are disposed. That is, the first and second transistor blocks BLK1 and BLK2 and the first capacitor C1 are connected to each other to generate a gate signal.

The second transistor block BLK2 is disposed at one side of the first transistor block BLK1 in a first direction DR1, and the first capacitor C1 is disposed at the other side of the first transistor block BLK1.

The first transistor T1 and the second transistor T2 of each of the stages SRCk and SRCk+1 may have approximately the same size. The first transistor T1 and the second transistor T2 may extend along a first direction DR1 and may be arranged side by side along a second direction DR2.

The second transistor T2 of the kth stage SRCk and the second transistor T2 of the k+1th stage SRCk+1 may be arranged to face each other. However, the present disclosure is not limited thereto and thus the first transistor T1 of the kth stage SRCk and the second transistor T2 of the k+1th stage SRCk+1 may instead be arranged to face each other. Additionally, the second transistor T2 of the kth stage SRCk and the first transistor T1 of the k+1th stage SRCk+1 may be arranged to face each other.

The third to sixteenth transistors T3 to T16 of each of the kth and k+1th stages SRCk and SRCk+1 are arranged to be adjacent to like sides of the first and second transistors T1 and T2. The first capacitors C1 of each of the kth and k+1th stages SRCk and SRCk+1 are arranged to be adjacent to the opposite sides of the first and second transistors T1 and T2.

The repair block RB may include a first repair block RB1 and second repair blocks RB2. The first repair block RB1 is disposed between the first transistor blocks BLK1 and the first capacitors C1 of the kth and k+1th stages SRCk and SRCk+1.

In more detail, the first repair block RB1 may be disposed between the second transistors T2 and the first capacitors C1 of the kth and k+1th stages SRCk and SRCk+1.

The second repair blocks RB2 may be disposed at opposing sides of the second transistor blocks BLK2 and between the second transistor blocks BLK2 and the first transistor blocks BLK1.

In more detail, the second repair blocks RB2 may be disposed at like sides of the second transistor blocks BLK2 of the K and k+1th stages SRCk and SRCk+1 and between the second transistor blocks BLK2 and the second transistors T2.

As an exemplary embodiment, one first repair block RB1 is shown in FIG. 5. However, the present disclosure is not limited thereto and thus, two or more first repair blocks RB1 may be disposed between the first transistor blocks BLK1 and the first capacitors C1 of the kth and k+1th stages SRCk and SRCk+1.

As an exemplary embodiment, the two second repair blocks RB2 are respectively disposed at opposite sides of the second transistor blocks BLK2 of the kth and k+1th stages SRCk and SRCk+1. However, the present disclosure is not limited thereto and thus, more than two second repair blocks RB may be disposed at various sides of the second transistor blocks BLK2 of the kth and k+1th stages SRCk and SRCk+1, and between other sides of the second transistor blocks BLK2 and the first transistor blocks BLK1.

The first transistor T1 of each of the stages SRCk and SRCk+1 includes a plurality of first transistor units TU1. Additionally, the second transistor T2 of each of the stages SRCk and SRCk+1 includes a plurality of second transistor units TU2.

As an exemplary embodiment, three first transistor units TU1 and three second transistor units TU2 are shown in FIG. 5. However, the present disclosure is not limited thereto and the first transistor T1 may include two first transistor units TU1 or more than three first transistor units TU1. Additionally, the second transistor T2 may include two second transistor units TU2 or more than three second transistor units TU2. Any number of transistor units is contemplated for any of the transistors.

Each of the first transistors T1 and each of the second transistors T2 may have substantially the same size. The first repair block RB1 may have substantially the same size as each first transistor unit TU1 or each second transistor unit TU2.

Figure 6:
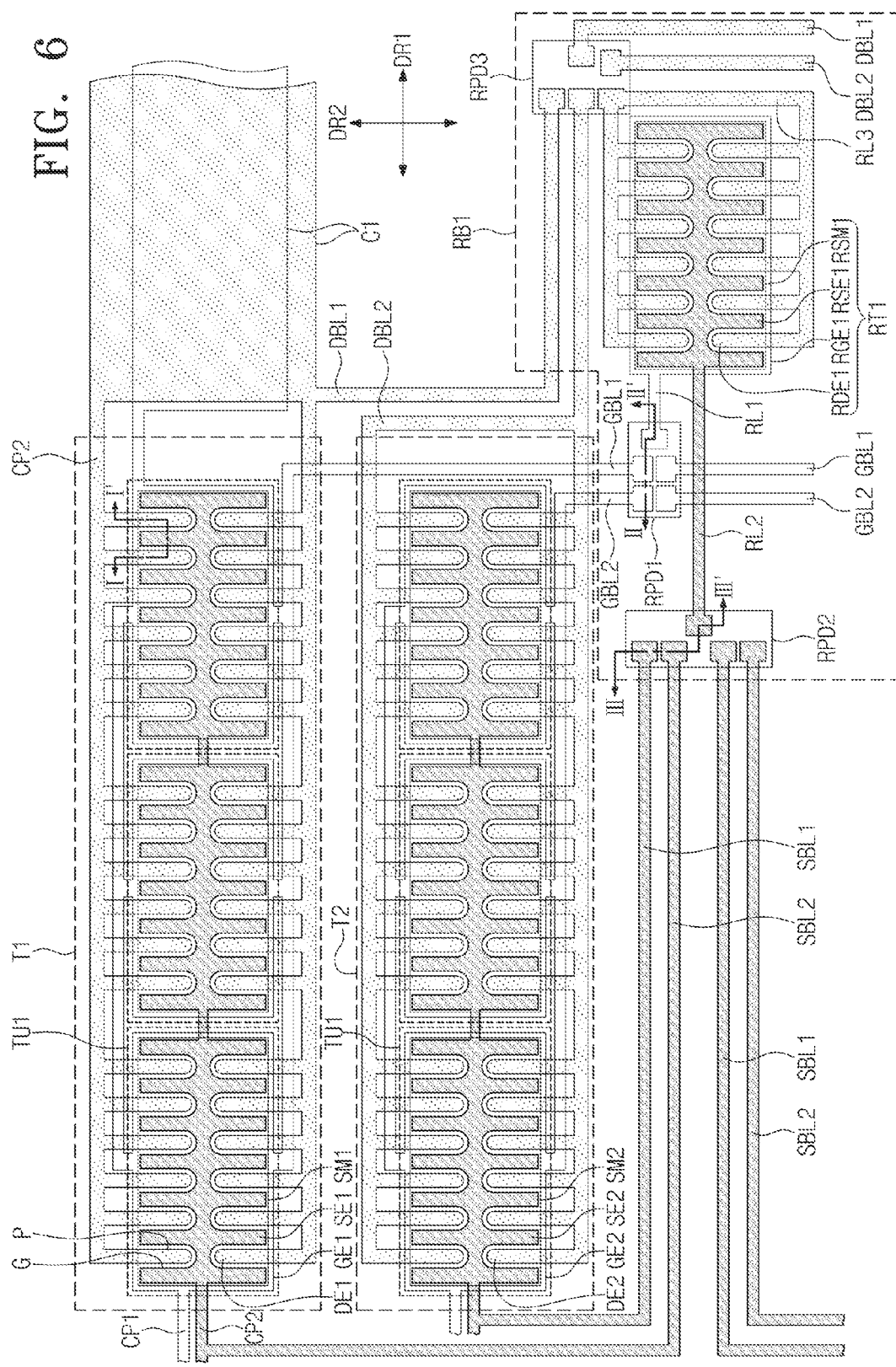
FIG. 6 is a plan view illustrating first and second transistors and a first repair block of a kth stage shown in FIG. 5.
Figure 7:
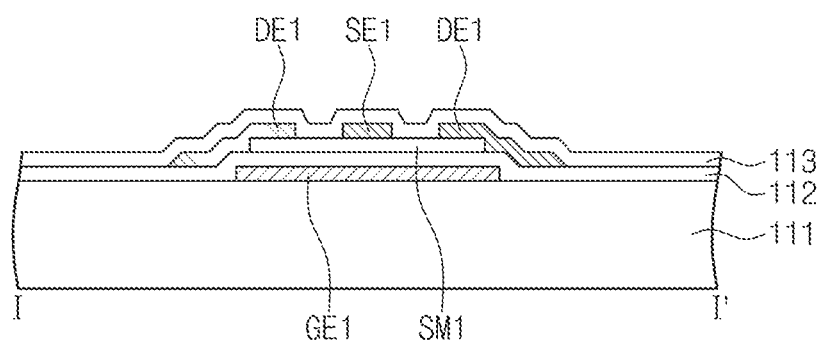
FIG. 7 is a cross-sectional view taken along line I-I' of FIG. 6 according to an embodiment of the present disclosure.
Figure 8:
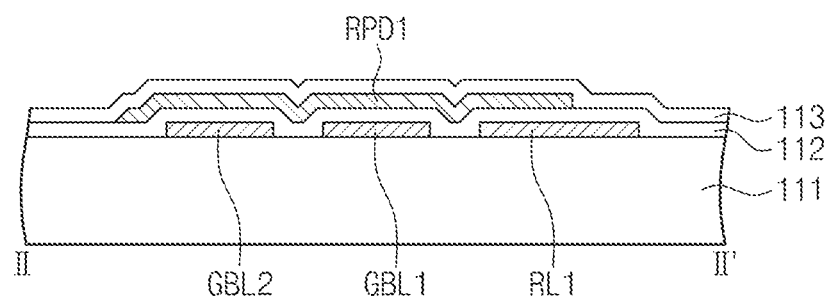
FIG. 8 is a cross-sectional view taken along line II-II' of FIG. 6 according to an embodiment of the present disclosure.
Figure 9:
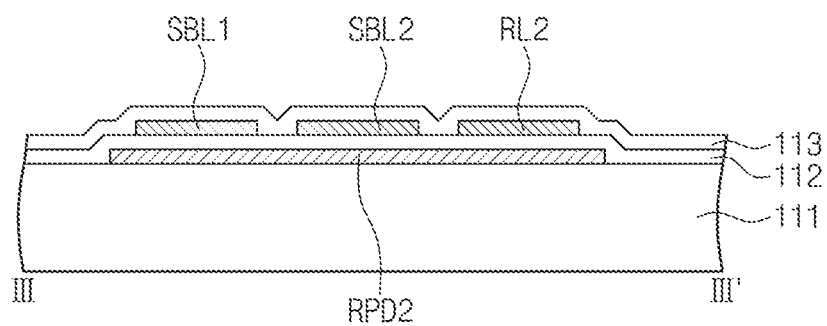
FIG. 9 is a cross-sectional view taken along line III-III' of FIG. 6 according to an embodiment of the present disclosure.

FIG. 6 is a plan view illustrating first and second transistors and a first repair block of a kth stage shown in FIG. 5. FIG. 7 is a cross-sectional view taken along line I-I' of FIG. 6 according to an embodiment of the present disclosure. FIG. 8 is a cross-sectional view taken along line II-II' of FIG. 6 according to an embodiment of the present disclosure. FIG. 9 is a cross-sectional view taken along line III-III' of FIG. 6 according to an embodiment of the present disclosure.

Referring to FIGS. 6 to 9, the first transistor T1 has multiple first transistor units TU1 connected to each other along first direction DR1. The second transistor T2 likewise has multiple second transistor units TU2 connected to each other along first direction DR1.

The first transistor T1 and the second transistor T2 have substantially the same configuration and substantially the same size. Accordingly, hereinafter, a configuration of the first transistor T1 is described in detail and a configuration of the second transistor T2 is described briefly or omitted.

Each of the first transistor units TU1 includes a first gate electrode GE1, a first semiconductor layer SM1, a first source electrode SE1, and a first drain electrode DE1. The first transistor units TU1 are disposed on a first base substrate 111. The first substrate 110 includes the first base substrate 111.

In more detail, the first gate electrodes GE1 are disposed on the first base substrate 111. The first gate electrodes GE1 are formed by branching from a first conductive pattern CP1. The first conductive pattern CP1 may be a conductive pattern for forming the control electrodes of the first to sixteenth transistors T1 to T16. The first conductive pattern CP1 is formed at the same layer, through the same process, as the gate lines GL1 to GLm.

The first gate electrodes GE1 may be formed in a rectangular shape with a long side along the first direction DR1 and a short side along the second direction DR2. The first gate electrodes GE1 of the first transistor units TU1 are arranged along the first direction DR1 to be connected to each other.

A first insulation layer 112 is disposed on the first base substrate 111 to cover the first gate electrodes GE1. The first insulation layer 112 may be defined as a gate insulation layer. First semiconductor layers SM1 overlapping the first gate electrodes GE1 are disposed on the first insulation layer 112. Although not shown in the drawings, each of the first semiconductor layers SM1 may include an active layer and an ohmic contact layer.

First source electrodes SE1 and first drain electrodes DE1 are formed spaced apart from each other over the first semiconductor layers SM1 and the first insulation layer 112. The first source electrodes SE1 and the first drain electrodes DE1 may be formed by branching from a second conductive pattern CP2.

The second conductive pattern CP2 may be a conductive pattern for forming the input electrodes and the output electrodes of the first to sixteenth transistors T1 to T16. The second conductive pattern CP2 is formed at the same layer, through the same process, as the data lines DL1 to DLn.

The first source electrodes SE1 of the first transistor units TU1 are connected to each other. The first drain electrodes DE1 of the first transistor units TU1 are connected to each other. The first semiconductor layers SM1 form a conductive channel between the first source electrodes SE1 and the first drain electrodes DE1.

Each of the first source electrodes SE1 includes a plurality of grooves G extending in the second direction DR2. Each groove G is recessed in from an edge of the first source electrodes SE1 to the interior thereof. That is, the grooves G are disposed along the upper and lower sides of each of the first source electrodes SE1 and extend in the second direction DR2.

The first drain electrodes DE1 include a plurality of protruding parts P extending in the second direction DR2 and corresponding to, e.g. extending into, the grooves G. The protruding parts P are disposed to be adjacent to the grooves G. That is, the protruding parts P are disposed to be adjacent to the grooves G at the upper sides of the first source electrodes SE1 and the grooves G disposed at the lower sides of the first source electrodes SE1. The ends of the protruding parts P not adjacent to the grooves G in the second direction DR2 are connected to each other.

A second insulation layer 113 is disposed on the first insulation layer 112 and the first semiconductor layers SM1. The second insulation layer 113 may be defined as a passivation layer.

The first capacitor C1 includes a first electrode branching from the first gate electrode GE1 of the first transistor T1 and a second electrode branching from the first drain electrode DE1 of the first transistor T1. Although only a portion of the first capacitor C1 is shown in FIG. 6, substantially, the first capacitor may extend to be disposed adjacent to a first repair transistor RT1.

The interconnected first gate electrodes GE1 of the first transistor units TU1 extend to be connected to a first gate branch line GBL1. The interconnected second gate electrodes GE2 of the second transistor units TU2 extend to be connected to a second gate branch line GBL2.

The interconnected first source electrodes SE1 of the first transistor units TU1 extend to be connected to a first source branch line SBL1. The interconnected second source electrodes SE2 of the second transistor units TU2 extend to be connected to a second source branch line SBL2.

The interconnected first drain electrodes DE1 of the first transistor units TU1 extend to be connected to a first drain branch line DBL1. The interconnected second drain electrodes DE2 of the second transistor units TU2 extend to be connected to a second drain branch line DBL2.

The first repair block RB1 includes a first repair transistor RT1, a plurality of repair lines RL1, RL2, and RL3, and a plurality of repair pads RPD1, RPD2, and RPD3. The first repair transistor RT1 is a repair device.

The first repair transistor RT1 may substantially have the same size and the same configuration as one first transistor unit TU1. For example, the first repair transistor RT1 includes a first repair gate electrode RGE1 having the same size and disposed at the same layer as the first gate electrode GE1, a first repair semiconductor layer RSM1 having the same size and disposed at the same layer as the first semiconductor layer SM1, a first repair source electrode RSE1 having the same size and disposed at the same layer as the first source electrode SE1, and a first repair drain electrode RDE1 having the same size and disposed at the same layer as the first drain electrode DE1.

The repair lines RL1, RL2, and RL3 include a first repair line RL1 extending from the first repair gate electrode RGE1, a second repair line RL2 extending from the first repair source electrode RSE1, and a third repair line RL3 extending from the first repair drain electrode RDE1.

The repair pads RPD1, RPD2, and RPD3 include a first repair pad RPD1 overlapping the first repair line RL1, a second repair pad RPD2 overlapping the second repair line RL2, and a third repair pad RPD3 overlapping the third repair line RL3.

As shown in FIG. 8, the first repair pad RPD1 is disposed at the same layer as the first source and drain electrodes SE1 and DE1. That is, the first repair pad RPD1 is disposed at the same layer as the second conductive layer CP2.

As shown in FIG. 9, the second repair pad RPD2 is disposed at the same layer as the first gate electrode GE1. Although not shown in a cross-sectional view, the third repair pad RPD3 is also disposed at the same layer as the first gate electrode GE1. That is, the second and third repair pads RPD2 and RPD3 are disposed at the same layer as the first conductive layer CP1.

The first gate branch line GBL1 and the second gate branch line GBL2 are disposed to overlap the first repair pad RPD1. Although a configuration of the k+1th stage SRCk+1 is not shown, the first gate branch line GBL1 and the second gate branch line GBL2 of the k+1th stage SRCk+1 may also be disposed to overlap the first repair pad RPD1.

The first source branch line SBL1 and the second source branch line SBL2 are disposed to overlap the second repair pad RPD2. The first source branch line SBL1 and the second source branch line SBL2 of the k+1th stage SRCk+1 are also disposed to overlap the second repair pad RPD2.

The first drain branch line DBL1 and the second drain branch line DBL2 are disposed to overlap the third repair pad RPD3. The first drain branch line DBL1 and the second drain branch line DBL2 of the k+1th stage SRCk+1 are also disposed to overlap the third repair pad RPD3.

Figure 10:
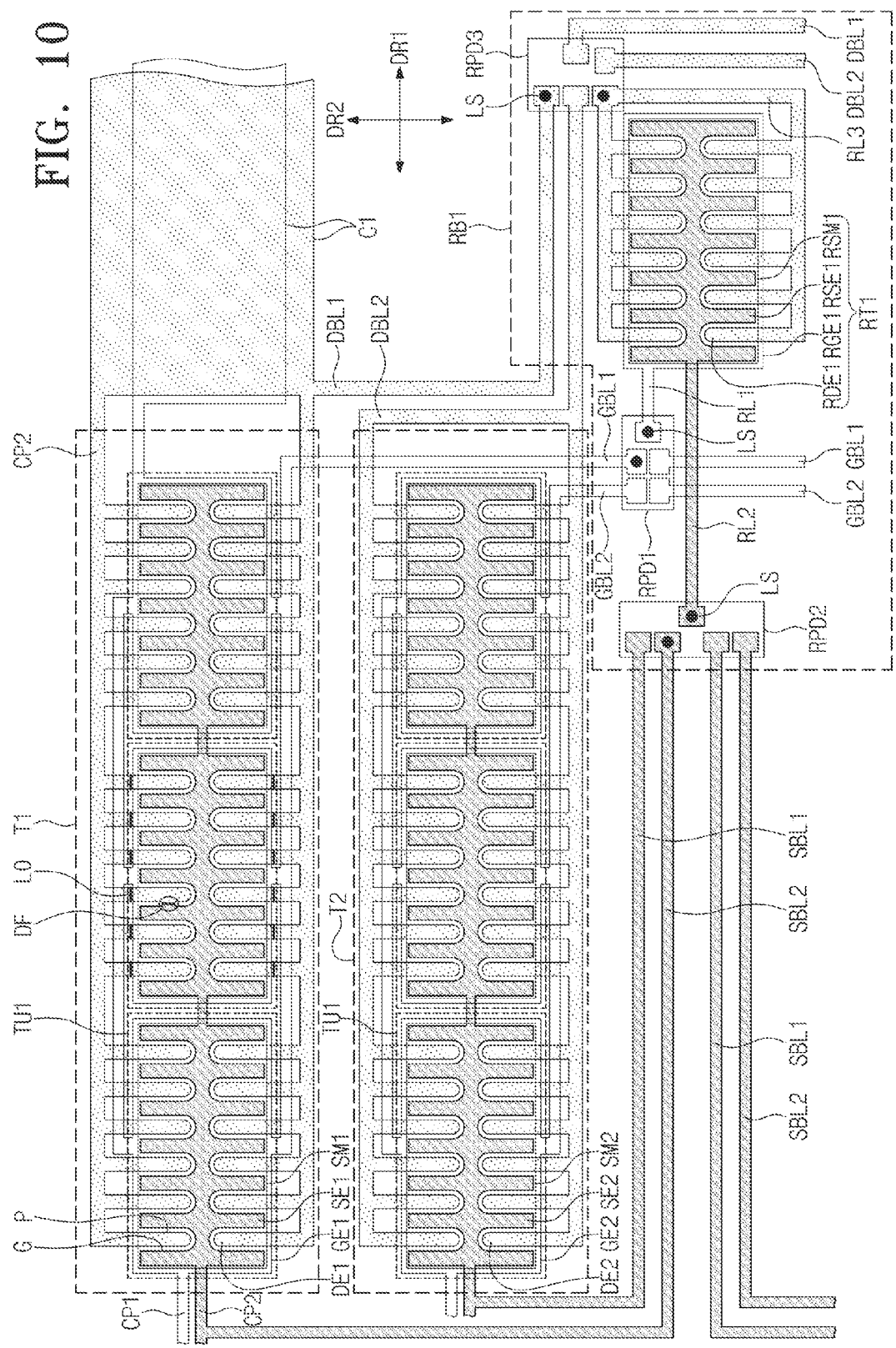
FIG. 10 is a view illustrating the repair of any one stage by using a first repair block.

FIG. 10 is a view illustrating the repair of any one stage by using a first repair block.

Referring to FIG. 10, the first source electrode SE1 and the first drain electrode DE1 are short-circuited in the first transistor unit TU1 disposed at the center of the first transistors units TU1 of the kth stage SRCk, so that a defect DF is present in the first transistor T1.

Although a short circuit between the first source electrode SE1 and the first drain electrode DE1 is shown, various other defects may occur in the first transistor units TU1. For example, when the first gate electrode GE1 and the first source and first drain electrodes SE1 and DE1 may be short-circuited or a channel of the first transistor units TU1 is burnt, defects may occur in the first transistor units TU1

The first drain electrodes DE1 of the damaged first transistor unit TU1 are cut (see LO) by laser. In more detail, a predetermined area of the protruding parts P is cut along the first direction DR1. Accordingly, the damaged first transistor unit TU1 is separated from the first transistor T1. The first drain electrodes DE1 of the undamaged first transistor units TU1 remain connected to each other.

The first gate branch line GBL1 overlapping the first repair pad RPD1 is short-circuited LS to the first repair pad RPD1 by laser. Additionally, the first repair line RL1 overlapping the first repair pad RPD1 is short-circuited LS to the first repair pad RPD1 by laser. Accordingly, the first gate branch line GBL1 and the first repair line RL1 are electrically connected to each other. That is, the first repair gate electrode RGE1 of the first repair transistor RT1 is electrically connected to the first gate electrodes GE1 of the first transistor T1.

The second source branch line SBL2 and the second repair line RL2 overlapping the second repair pad RPD2 are short-circuited LS to the second repair pad RPD2 by laser. Accordingly, the second source branch line SBL2 is electrically connected to the second repair line RL2. That is, the first repair source electrode RSE1 of the first repair transistor RT1 is electrically connected to the first source electrodes SE1 of the first transistor T1.

The first drain branch line DBL1 and the third repair line RL3 overlapping the third repair pad RPD3 are short-circuited LS to the third repair pad RPD3 by laser. Accordingly, the first drain branch line DBL1 and the third repair line RL3 are electrically connected to each other. That is, the first repair drain electrode RDE1 of the first repair transistor RT1 is electrically connected to the first drain electrodes DE1 of the first transistor T1.

As a result, the damaged first transistor unit TU1 may be removed from the first transistor T1 and the first repair transistor RT1 may be connected to the first transistor T1 instead of the damaged first transistor unit TU1. Accordingly, the first transistor T1 may be repaired by the first repair transistor RT1.

In the same manner, when the second transistor unit TU2 of one of the second transistor units TU2 of the kth stage SRCk is damaged, the second transistor T2 may be repaired by the first repair transistor RT1. Additionally, when the first transistor T1 or the second transistor T2 of the k+1th stage SRCk+1 is damaged, the first transistor T1 or the second transistor T2 may be repaired by the first repair transistor RT1.

The first transistor T1 may be formed as one continuous transistor that is not divided into first transistor units TU1 and that has a size corresponding to the sum of the sizes of the first transistor units TU1. That is, each of the stages may include a first transistor having a size corresponding to the sum of the sizes of the first transistor units TU1.

When a defect occurs in such a stage, a repair stage having the same configuration as the defective stage may be used. That is, even when only one transistor of a stage is damaged, the damaged stage itself is replaced with a repair stage. Accordingly, an area for placing a repair stage is the same size as that of the damaged stage. Additionally, even when only one transistor of a stage is damaged, since the entire damaged stage is replaced by a repair stage, the repair of a gate driving unit is accomplished inefficiently.

However, according to an embodiment of the present disclosure, the first transistor T1 is divided into multiple first transistor units TU1. Accordingly, when any one first transistor unit TU1 is damaged, a first repair transistor RT1 corresponding to the size of a first transistor unit TU1 is used to repair the damaged first transistor unit TU1. As a result, compared to when a repair stage is used, an area for placing the first repair transistor RT1 is reduced and the repair of the gate driving unit 200 is performed more efficiently and more easily.

The probability that all the first transistor units TU1 will be damaged is much lower than the probability that any one first transistor unit TU1 will be damaged. The probability that all the first and second transistors T1 and T2 will be damaged is much lower than the probability that any one of the first transistor unit TU1 and the second transistor T2 will be damaged. Additionally, the probability that both stages will be damaged is much lower than the probability that one stage will be damaged.

Accordingly, one first repair block RB may be disposed for at least two stages. However, the present disclosure is not limited thereto and as mentioned above, the first repair block RB1 may be disposed to repair more than two stages.

As an exemplary embodiment, one first repair block RB1 is disposed in the kth and k+1th stages SRCk and SRCk+1 to repair the kth and k+1th stages SRCk and SRCk+1. However, the present disclosure is not limited thereto and as mentioned above, a plurality of first repair blocks RB1 are disposed in the kth and k+1th stages SRCk and SRCk+1 to repair the kth and k+1th stages SRCk and SRCk+1. That is, at least one first repair block RB1 may be disposed to repair the kth and k+1th stages SRCk and SRCk+1.

For example, when two first repair blocks RB1 are disposed to share the kth and k+1th stages SRCk and SRCk+1, two damaged first and second transistor units TU1 and TU2 may be repaired by two first repair transistors RT.

Figure 11:
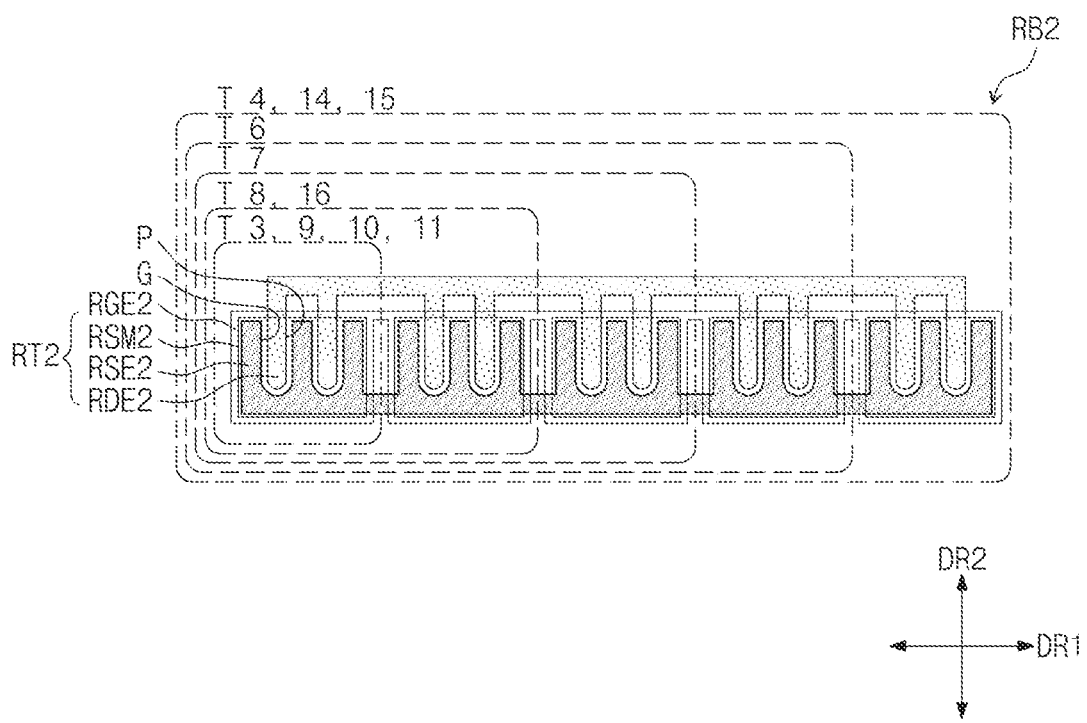
FIG. 11 is a view of comparing the sizes of second repair transistors of a second repair block and transistors of each stage.
Figure 12:
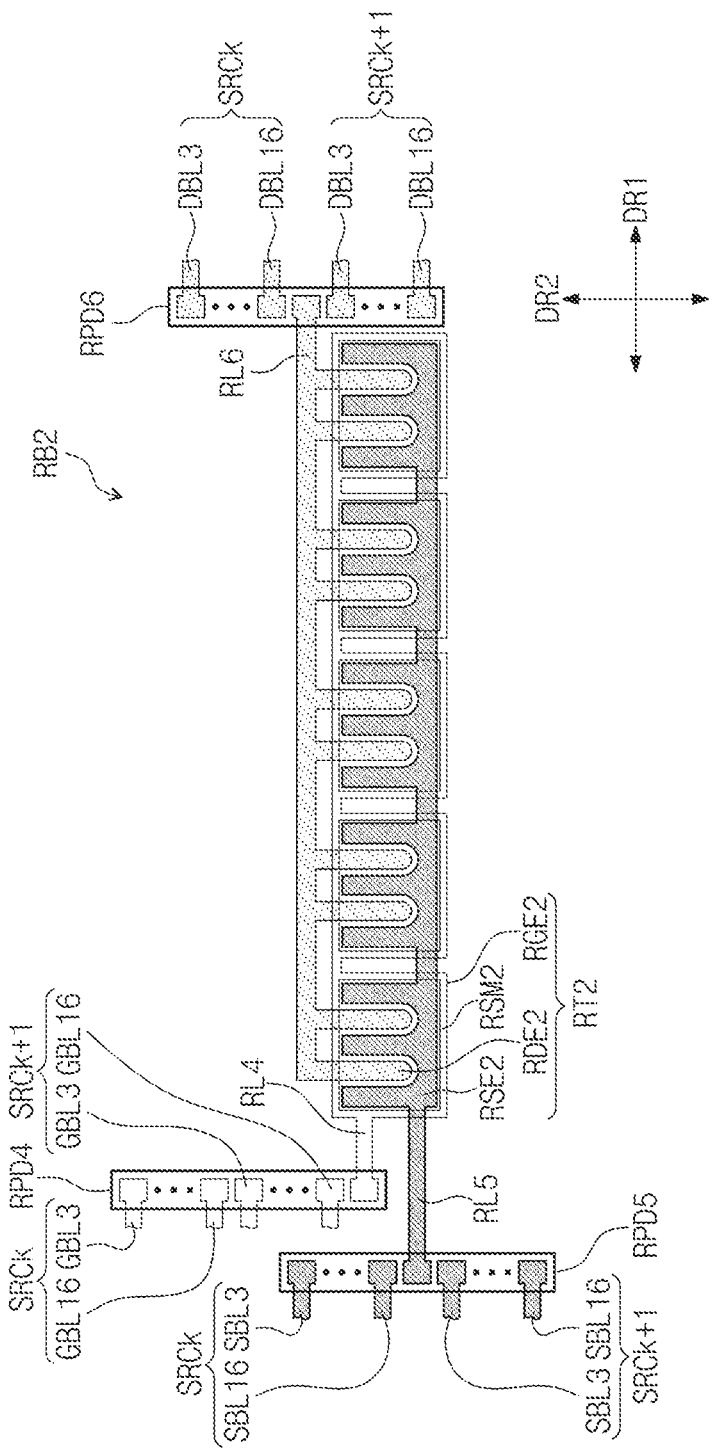
FIG. 12 is a view illustrating a second repair block and a connection configuration of branch lines of stages adjacent thereto.

FIG. 11 is a view comparing the sizes of second repair transistors of a second repair block and transistors of each stage. FIG. 12 is a view illustrating a second repair block and a connection configuration of branch lines of stages adjacent thereto.

Although one second repair block is shown in FIGS. 11 and 12, other repair blocks shown in FIG. 5 may have substantially the same configuration.

Referring to FIGS. 11 and 12, the second repair block RB2 includes a plurality of second repair transistors RT2, a plurality of repair lines RL4, RL5, and RL6, and a plurality of repair pads RPD4, RPD5, and RPD6. The second repair transistors RT2 are repair devices. The second repair transistors RT2 are arranged along the first direction DR1 to be connected to each other.

Each of the second repair transistors RT2 includes a second repair gate electrode RGE2, a second repair semiconductor layer RSM2, a second repair source electrode RSE2, and a second repair drain electrode RDE2.

A plurality of grooves G may be formed in one side of the second repair source electrode RSE2 of each second repair transistor RT2 to extend in the second direction DR2. The second repair drain electrode RDE2 of each second repair transistor RT2 includes a plurality of protruding parts P extending in the second direction DR2 to be disposed adjacent to (i.e. within, in plan view) the grooves G of the second repair source electrode RSE2.

The size of a second repair transistor RT2 is smaller than the size of a first repair transistor RT1. Except for their size, the second repair transistors RT2 have substantially the same configuration as the first repair transistors RT1.

The second repair gate electrodes RGE2 of the second repair transistors RT2 are connected to each other. The second repair source electrodes RSE2 of the second repair transistors RT2 are connected to each other. The second repair drain electrodes RDE2 of the second repair transistors RT2 are connected to each other.

The repair lines RL4, RL5, and RL6 of the second repair block RB2 include a fourth repair line RL4 extending from the second repair gate electrodes RGE2, a fifth repair line RL5 extending from the interconnected second repair source electrodes RSE2, and a sixth repair line RL6 extending from the interconnected second repair drain electrodes RDEs.

The repair pads RPD4, RPD5, and RPD6 of the second repair block RB2 include a fourth repair pad RPD4 overlapping the fourth repair line RL4, a fifth repair pad RPD5 overlapping the fifth repair line RL5, and a sixth repair pad RPD6 overlapping the sixth repair line RL6.

In this embodiment, the fourth repair pad RPD4 is disposed at the same layer as the first repair pad RPD1, and the fifth and sixth repair pads RPD5 and RPD6 are disposed at the same layer as the second and third repair pads RPD2 and RPD3.

The sizes of the first and second transistors T1 and T2 are greater than the sizes of the third to sixth transistors T3 to T16. The third to sixteenth transistors T3 to T16 have substantially the same configuration as the first and second transistors T1 and T2 except for their sizes.

Accordingly, for convenience of description, a specific configuration of the third to sixteenth transistors T3 to T16 is not shown in FIGS. 11 and 12, and dotted line blocks are shown in FIG. 11 to compare the sizes of the second repair transistors RT2 to the third through sixteenth transistors T3 to T16.

The size of each of the third, ninth, tenth, and eleventh transistors T3, T9, T10, and T11 may each be substantially identical to the size of one second repair transistor RT2.

The sizes of the eighth and sixteenth transistors T8 and T16 are greater than the sizes of the third, ninth, tenth, and eleventh transistors T3, T9, T10, and T11. The size of each of the eighth and sixteenth transistors T8 and T16 may be substantially identical to the size of two second repair transistors RT2.

The size of the seventh transistor T7 is greater than the sizes of the eighth and sixteenth transistors T8 and T16. The size of the seventh transistor T7 may be substantially identical to the size of three second repair transistors RT2.

The size of the sixth transistor T6 is greater than the size of the seventh transistor T7. The size of the sixth transistor T6 may be substantially identical to the size of four second repair transistors RT2.

The sizes of the fourth, fourteenth, and fifteenth transistors T4, T14, and T15 are greater than the size of the sixth transistor T6. The size of each of the fourth, fourteenth, and fifteenth transistors T4, T14, and T15 may be substantially identical to the size of five second repair transistors RT2.

That is, the second repair transistors RT2 may be formed with five different transistors. Embodiments of the invention include second repair transistors RT2 with a number of repair transistors that corresponds to the size of the largest transistors which it is intended to repair.

The third, fourth, sixth to eleventh, and fourteenth to sixteenth gate branch lines extending from the gate electrodes of the third, fourth, sixth to eleventh, and fourteenth to sixteenth transistors T3, T4, T6 to T11, and T14 to T16 of the kth and k+1th stages SRCk and SRCk+1 are disposed to overlap the fourth repair pad RPD4. For convenience of description, only the third and sixteenth gate branch lines GBL3 and GBL16 are shown in FIG. 12.

The third, fourth, sixth to eleventh, and fourteenth to sixteenth source branch lines extending from the source electrodes of the third, fourth, sixth to eleventh, and fourteenth to sixteenth transistors T3, T4, T6 to T11, and T14 to T16 of the kth and k+1th stages SRCk and SRCk+1 are disposed to overlap the fifth repair pad RPD5. For convenience of description, only the third and sixteenth source branch lines SBL3 and SBL16 are shown in FIG. 12.

The third, fourth, sixth to eleventh, and fourteenth to sixteenth drain branch lines extending from the drain electrodes of the third, fourth, sixth to eleventh, and fourteenth to sixteenth transistors T3, T4, T6 to T11, and T14 to T16 of the kth and k+1th stages SRCk and SRCk+1 are disposed to overlap the sixth repair pad RPD6. For convenience of description, only the third and sixteenth drain branch lines DBL3 and DBL16 are shown in FIG. 12.

The sizes of the fifth, twelfth, and thirteenth transistors T5, T12, and T13 are greater than the sizes of the third, ninth, tenth, and eleventh transistors T3, T9, T10, and T11. The gate, source, and drain electrodes of the fifth, twelfth, and thirteenth transistors T5, T12, and T13 do not overlap the fourth, fifth, and sixth repair pads RPD4, RPD5, and RPD6.

The probability that the first and second transistors T1 and T2 will be damaged is higher than the probability that the third, fourth, sixth to eleventh, and fourteenth to sixteenth transistors T3, T4, T6 to T11, and T14 to T16 will be damaged. The probability that the third, fourth, sixth to eleventh, and fourteenth to sixteenth transistors T3, T4, T6 to T11, and T14 to T16 will be damaged is higher than the probability that the fifth, twelfth, and thirteenth transistors T5, T12, and T13 will be damaged.

Figure 13:
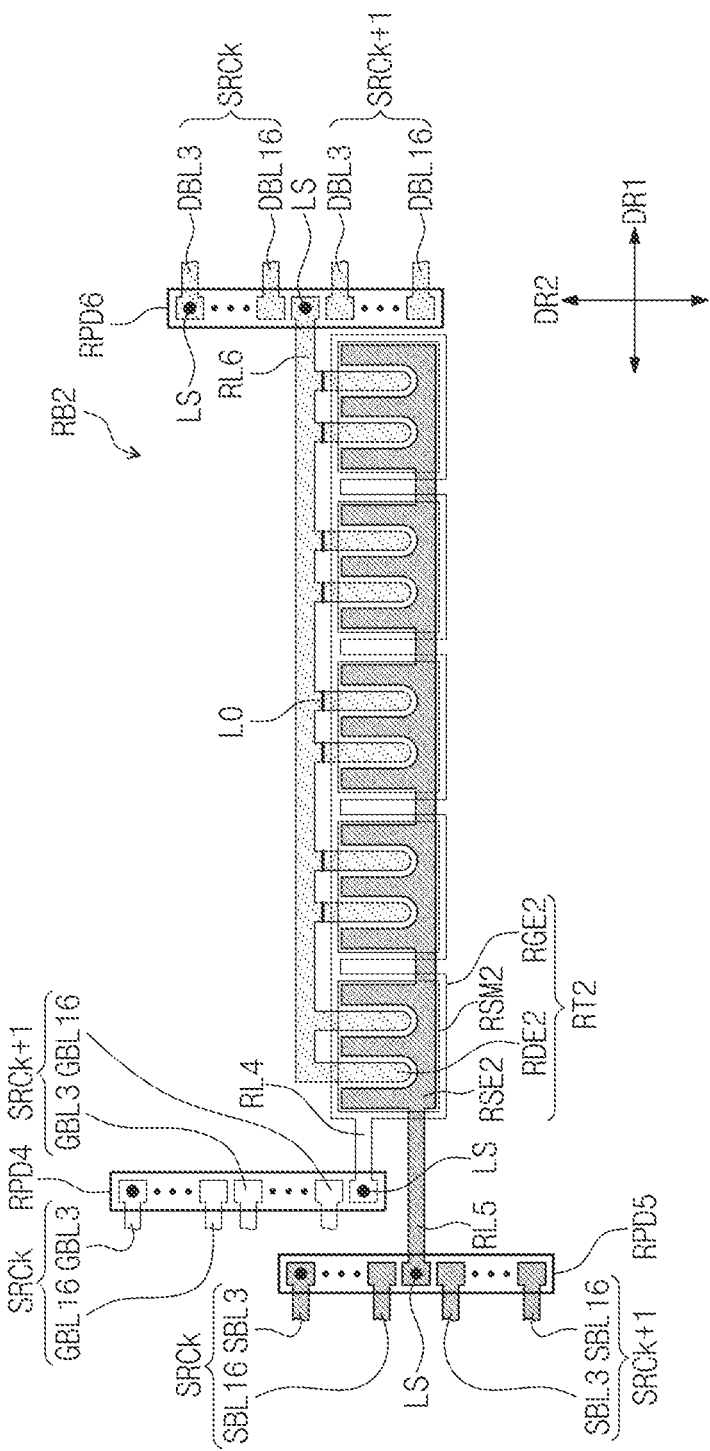
FIGS. 13 and 14 are views illustrating the repair of one stage by using a second repair block.
Figure 14:
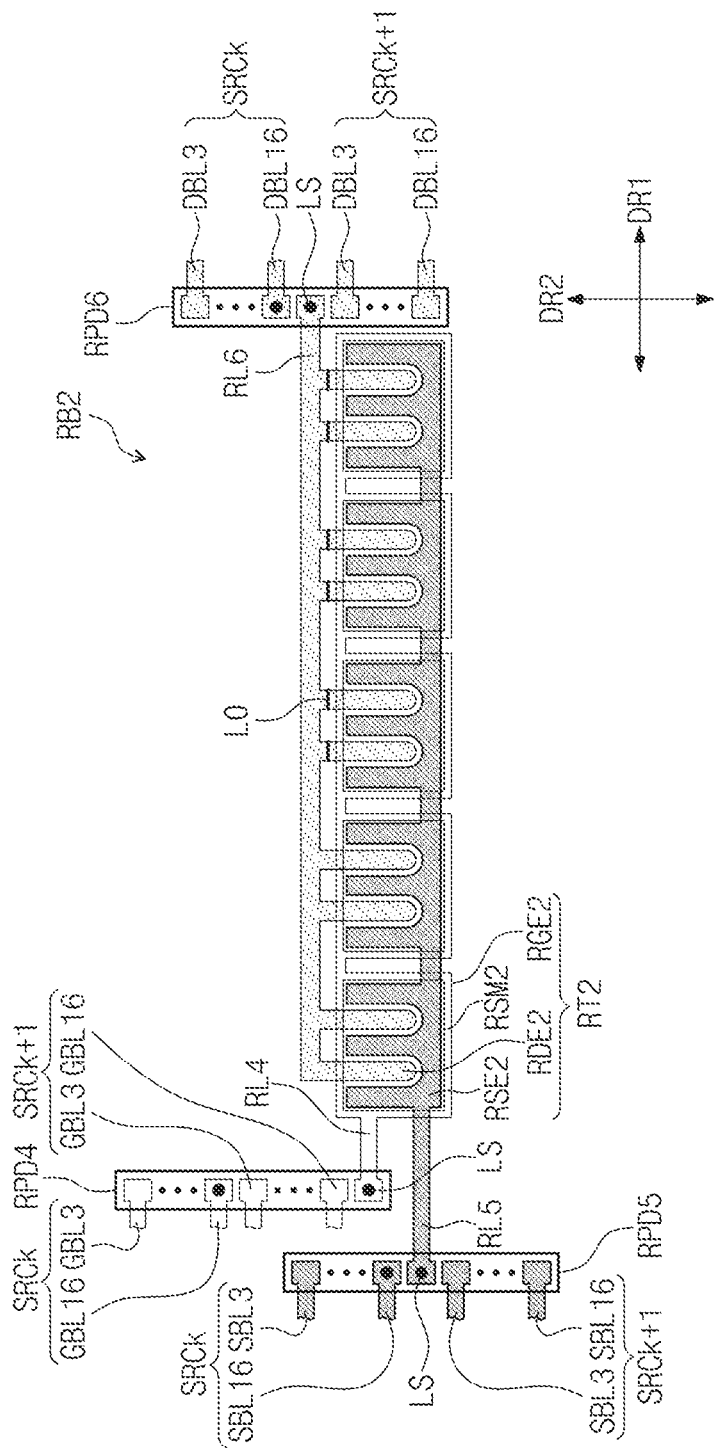

FIGS. 13 and 14 are views illustrating the repair of one stage by using a second repair block.

Referring to FIG. 13, one of the third, ninth, tenth, and eleventh transistors T3, T9, T10, and T11 of the kth stage SRCk may be damaged. For example, the third transistor T3 may be damaged. Although not shown in the drawing, in such a case, the drain electrode of the damaged third transistor T3 is cut by laser as described with reference to FIG. 10.

The fourth repair line RL4 and the third gate branch line GBL3 extending from the third transistor T3 are short-circuited to the fourth repair pad RPD4 by laser. The fifth repair line RL5 and the third source branch line SBL3 extending from the third transistor T3 are short-circuited to the fifth repair pad RPD5 by laser. The sixth repair line RL6 and the third drain branch line DBL3 extending from the third transistor T3 are short-circuited to the sixth repair pad RPD6 by laser.

The second repair drain electrodes RDE2 of the remaining four second repair transistors RT2 are cut (see LO) by laser, so that one second repair transistor RT2, corresponding to the size of the third transistor T3, remains.

In more detail, a predetermined area of the protruding parts P outside the grooves G is cut along the second direction DR2. Accordingly, the damaged third transistor T3 is removed and one second repair transistor RT2 may replace the third transistor T3.

Referring to FIG. 14, any one of the eighth and sixteenth transistors T8 and T16 of the kth stage SRCk may be damaged. For example, the sixteenth transistor T16 may be damaged. Although not shown in the drawing, in such a case, the drain electrode of the damaged sixteenth transistor T16 is cut by laser as described with reference to FIG. 10.

The fourth repair line RL4 and the sixteenth gate branch line GBL16 extending from the sixteenth transistor T16 are short-circuited to the fourth repair pad RPD4 by laser. The fifth repair line RL5 and the sixteenth source branch line SBL16 extending from the sixteenth transistor T16 are short-circuited to the fifth repair pad RPD5 by laser. The sixth repair line RL6 and the sixteenth drain branch line DBL16 extending from the sixteenth transistor T16 are short-circuited to the sixth repair pad RPD6 by laser.

The second repair drain electrodes RDE2 of three second repair transistors RT2 are cut (see LO) by laser, so that two second repair transistor RT2 remain, corresponding to the size of the sixteenth transistor T16.

Accordingly, the damaged sixteenth transistor T16 is removed and two second repair transistor RT2 may replace the sixteenth transistor T16. As a result, the damaged sixteenth transistor T16 may be repaired by two second repair transistors RT2.

One of ordinary skill in the art will realize that, when the seventh transistor T7 is damaged, three second repair transistors RT2 may replace the seventh transistor T7, in similar manner to the above. When the sixth transistor T6 is damaged, four second repair transistors RT2 may replace the sixth transistor T6. When one of the fourth, fourteenth, and fifteenth transistors T4, T14, and T15 is damaged, five second repair transistors RT2 may replace the damaged transistor.

Additionally, when any one of the third, fourth, sixth to eleventh, and fourteenth to sixteenth transistors T3, T4, T6 to T11, and T14 to T16 of the k+1th stage is damaged, the damaged transistor may be repaired by the second repair transistors RT2.

Since two second repair blocks RB2 are disposed in or adjacent to the kth and k+1th stages SRCk and SRCk+1, any two of the third, fourth, sixth to eleventh, and fourteenth to sixteenth transistors T3, T4, T6 to T11, and T14 to T16 of the kth and k+1th stages SRCk and SRCk+1 may be repaired.

In an embodiment of the present disclosure, when any one of the third, fourth, sixth to eleventh, and fourteenth to sixteenth transistors T3, T4, T6 to T11, and T14 to T16 is damaged, the second repair transistors RT2 may be used to repair the damaged transistor. As a result, compared to when a conventional repair stage is used, an area taken up by the second repair transistor RT2 is smaller and the repair of the gate driving unit 200 is performed more efficiently and easily.

As an exemplary embodiment, two second repair blocks RB2 are disposed in or proximate to the kth and k+1th stages SRCk and SRCk+1 to share the kth and k+1th stages SRCk and SRCk+1. However, the present invention is not limited thereto and as mentioned above, more than two second repair blocks RB2 may be disposed in or near the kth and k+1th stages SRCk and SRCk+1 to share (i.e. be used by either or both of) the kth and k+1th stages SRCk and SRCk+1.

Additionally, as an exemplary embodiment, the first repair block RB1 and the second repair blocks RB2 are disposed to share the kth and k+1th stages SRCk and SRCk+1. However, the present invention is not limited thereto and since the probability that the first and second transistors T1 and T2 will be damaged may be the highest, only the first repair block RB1 may be disposed in or near the kth and k+1th stages SRCk and SRCk+1 to share the kth and k+1th stages SRCk and SRCk+1. Additionally, the present invention is not limited thereto and as mentioned above, only the second repair blocks RB2 may be disposed in or near the kth and k+1th stages SRCk and SRCk+1 to share the kth and k+1th stages SRCk and SRCk+1. Other repair blocks may be located remote from their stages.

In an embodiment of the present invention, repair blocks RB are disposed in the gate driving unit 200 to share respectively corresponding stages. Accordingly, when the first to sixteenth transistors T1 to T16 are damaged, an entire stage including the damaged transistor is not replaced with a repair stage and only the damaged transistor may be replaced with the first and second repair transistors RT1 and RT2 of the repair block RB.

As a result, the gate driving unit 200 and the display device 500 including the same according to an embodiment of the present invention may repair the gate driving unit 200 more efficiently.

According to an embodiment of the present invention, a gate driving unit and a display device including the same may perform repair of the gate driving unit more efficiently.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description. Furthermore, different features of the various embodiments, disclosed or otherwise understood, can be mixed and matched in any manner to produce further embodiments within the scope of the invention.

What is claimed is:

1. A gate driving unit comprising:
   a plurality of stages configured to be activated sequentially so as to generate gate signals; and
   a plurality of repair blocks having sizes smaller than the corresponding stages and configured to repair defects of the stages,
   wherein each of the repair blocks is disposed proximate to two or more stages so as to be configured to repair defects in each of the two or more stages, and the number of the repair blocks is less than the number of the stages.

2. The gate driving unit of claim 1, wherein each of the stages comprises first and second transistor blocks connected to each other to generate the gate signal and a first capacitor, and wherein the second transistor block is disposed proximate to one side of the first transistor block and a first capacitor is disposed proximate to another side of the first transistor block.

3. The gate driving unit of claim 2, wherein each of the repair blocks is disposed between adjacent stages, so that each of the repair blocks is disposed between a kth stage and a k+1th stage, where k is an odd number.

4. The gate driving unit of claim 3, wherein the repair blocks comprise at least one repair block disposed between the first transistor blocks and the first capacitors of the kth and k+1th stages.

5. The gate driving unit of claim 3, wherein the repair blocks comprise a plurality of second repair blocks disposed between the second transistor blocks of the kth and k+1th stages, and the first and second transistor blocks.

6. The gate driving unit of claim 3, wherein the repair blocks comprise:
a first repair block disposed between the first transistor blocks and the first capacitors of the kth and k+1th stages; and
second repair blocks disposed between the second transistor blocks of the kth and k+1th stages, and the first and second transistor blocks.

7. The gate driving unit of claim 6, wherein
the first transistor block comprises first and second transistors;
the second transistor block comprises third to sixteenth transistors that are smaller than the first and second transistors; and
the first and second transistors have the same size, are each shaped to extend in a first direction, and are arranged side by side along a second direction intersecting the first direction.

8. The gate driving unit of claim 7, wherein the first to sixteenth transistors comprise an amorphous silicon thin film transistor or an oxide thin film transistor.

9. The gate driving unit of claim 7, wherein the second transistor of the kth stage and the second transistor of the k+1th stage face each other.

10. The gate driving unit of claim 7, wherein
the first repair block is disposed between the second transistors and the first capacitors of the kth and k+1th stages; and
the second repair blocks are disposed between the second transistor blocks of the kth and k+1th stages, and the second transistor blocks and the second transistors.

11. The gate driving unit of claim 7, wherein
the first transistors comprise a plurality of connected first transistor units arranged along the first direction; and
the second transistors comprise a plurality of connected second transistor units arranged along the first direction.

12. The gate driving unit of claim 11, wherein each of the first transistor units comprises:
a first gate electrode extending from a first conductive pattern; and
a first source electrode and a first drain electrode extending from a second conductive pattern proximate to the first conductive pattern and having an insulation layer therebetween,
wherein the each of the second transistor units comprises:
a second gate electrode extending from the first conductive pattern; and
a second source electrode and a second drain electrode extending from the second conductive pattern, and wherein:

the first gate electrodes of the first transistor units are connected to each other;
the first source electrodes of the first transistor units are connected to each other;
the first drain electrodes of the first transistor units are connected to each other;
the second gate electrodes of the second transistor units are connected to each other;
the second source electrodes of the second transistor units are connected to each other; and
the second drain electrodes of the second transistor units are connected to each other.

13. The gate driving unit of claim 12, wherein the first repair block comprises:
a first repair transistor having the same size as at least one of the first transistor units or at least one of the second transistor units;
a first repair pad disposed at the same layer as the second conductive pattern; and
second and third repair pads disposed at the same layer as the first conductive pattern,
wherein the first repair transistor comprises a first repair gate electrode, a first repair source electrode, and a first repair drain electrode that respectively have substantially the same shapes and sizes as the first gate electrode, the first source electrode, and the first drain electrode.

14. The gate driving unit of claim 13, wherein
the first repair gate electrode extends so as to overlap the first repair pad;
the first repair source electrode extends so as to overlap the second repair pad; and
the first repair drain electrode extends so as to overlap the third repair pad.

15. The gate driving unit of claim 14, wherein
the first gate electrodes and the second gate electrodes extend so as to overlap the first repair pad;
the first source electrodes and the second source electrodes extend so as to overlap the second repair pad; and
the first drain electrodes and the second drain electrodes extend so as to overlap the third repair pad.

16. The gate driving unit of claim 7, wherein
the fourth, fourteenth, and fifteenth transistors are larger than the sixth transistor;
the sixth transistor is larger than the seventh transistor;
the seventh transistor is larger than the eighth and sixteenth transistors;
the eighth and sixteenth transistors are larger than the third, ninth, tenth, and eleventh transistors; and
the third, ninth, tenth, and eleventh transistors are larger than the fifth, twelfth, and thirteenth transistors.

17. The gate driving unit of claim 16, wherein each of the second repair blocks comprises:
a plurality of second repair transistors each including a second repair gate electrode, a second repair source electrode, and a second repair drain electrode;
a fourth repair pad disposed at the same layer as the second repair source and drain electrodes; and
fifth and sixth repair pads disposed at the same layer as the second repair gate electrode.

18. The gate driving unit of claim 17, wherein
each of the third, ninth, tenth, and eleventh transistors has the same size as one second repair transistor;
each of the eighth and sixteenth transistors has the same size as two second repair transistors;

the seventh transistor has the same size as three second repair transistors;

the sixth transistor has the same size as four second repair transistors; and each of the fourth, fourteenth, and fifteenth transistors has the same size as five second repair transistors.

19. The gate driving unit of claim 17, wherein the second repair gate electrodes of the second repair transistors are connected to each other and extend so as to overlap the fourth repair pad;

the repair source electrodes of the second repair transistors are connected to each other and extend so as to overlap the fifth repair pad; and the second repair drain electrodes of the second repair transistors are connected to each other and extend so as to overlap the sixth repair pad.

20. The gate driving unit of claim 19, wherein gate electrodes of the third, fourth, sixth to eleventh, and fourteenth to sixteenth transistors each extend so as to overlap the fourth repair pad;

source electrodes of the third, fourth, sixth to eleventh, and fourteenth to sixteenth transistors each extend so as to overlap the fifth repair pad; and drain electrodes of the third, fourth, sixth to eleventh, and fourteenth to sixteenth transistors each extend so as to overlap the sixth repair pad.

\* \* \* \* \*